(12) United States Patent
Kim et al.

(10) Patent No.: US 10,347,586 B2
(45) Date of Patent: Jul. 9, 2019

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Jin Su Kim, Suwon-Si (KR); Jeong Ho Lee, Suwon-Si (KR); Shang Hoon Seo, Suwon-Si (KR); Bong Ju Cho, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/986,302

(22) Filed: May 22, 2018

(65) Prior Publication Data

US 2019/0164895 A1  May 30, 2019

(30) Foreign Application Priority Data

Nov. 30, 2017 (KR) .................. 10-2017-0162707
Mar. 9, 2018 (KR) .................. 10-2018-0028218

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC . H01L 23/5389; H01L 24/19; H01L 23/3128; H01L 21/565; H01L 21/4853;
(Continued)

(56) References Cited

U.S. PATENT DOCUMENTS 9,999,134 B2 * 6/2018 Zhang .................. H05K 1/183
2006/0087037 A1   4/2006 Hsu
(Continued)

FOREIGN PATENT DOCUMENTS

CN   205122578 U   3/2016
CN   105575913 A   5/2016
(Continued)

OTHER PUBLICATIONS

Korean Office Action dated Apr. 3, 2019 issued in Korean Patent Application No. 10-2018-0028218 (with English translation).

*Primary Examiner* — Shouxiang Hu
(74) *Attorney, Agent, or Firm* — Morgan, Lewis & Bockius LLP

(57) ABSTRACT

A fan-out semiconductor package includes: a frame including insulating layers, wiring layers, and connection via layers, and having a recess portion and a stopper layer disposed on a bottom surface of the recess portion; a semiconductor chip having connection pads and disposed in the recess portion so that an inactive surface is disposed on the stopper layer; an encapsulant covering at least portions of the semiconductor chip and filling at least portions of the recess portion; a connection member disposed on the frame and an active surface of the semiconductor chip and including a redistribution layer electrically connecting the wiring layers and the connection pads to each other; and a guide pattern disposed adjacent to a wall of the recess portion and disposed in the frame. An edge of the bottom surface of the recess portion has a groove portion.

24 Claims, 21 Drawing Sheets

(51) Int. Cl.
*H01L 23/00* (2006.01)
*H01L 23/552* (2006.01)
*H01L 21/48* (2006.01)
*H01L 21/56* (2006.01)
*H01L 23/498* (2006.01)

(52) U.S. Cl.
CPC ........ *H01L 21/4857* (2013.01); *H01L 21/565* (2013.01); *H01L 23/3114* (2013.01); *H01L 23/3121* (2013.01); *H01L 23/3128* (2013.01); *H01L 23/49822* (2013.01); *H01L 23/49838* (2013.01); *H01L 23/5383* (2013.01); *H01L 23/5384* (2013.01); *H01L 23/5386* (2013.01); *H01L 23/552* (2013.01); *H01L 23/562* (2013.01); *H01L 24/19* (2013.01); *H01L 24/20* (2013.01); *H01L 2224/214* (2013.01); *H01L 2924/3025* (2013.01); *H01L 2924/3511* (2013.01)

(58) Field of Classification Search
CPC ... H01L 21/486; H01L 21/4857; H01L 24/20; H01L 23/3114; H01L 23/552; H01L 23/562; H01L 23/5386; H01L 23/5384; H01L 23/5383; H01L 2224/214; H01L 2224/3025; H01L 2924/3511; H01L 23/49822; H01L 23/49838; H01L 23/3121
See application file for complete search history.

(56) References Cited

U.S. PATENT DOCUMENTS

| | | | | |
|---|---|---|---|---|
| 2008/0142254 | A1* | 6/2008 | Wang | H01L 21/4857 174/259 |
| 2009/0294027 | A1* | 12/2009 | Wang | H01L 21/4857 156/150 |
| 2012/0087097 | A1* | 4/2012 | Hong | H01L 23/5389 361/763 |
| 2012/0181074 | A1* | 7/2012 | Ishihara | H05K 3/4691 174/261 |
| 2012/0287586 | A1 | 11/2012 | Mikado et al. | |
| 2016/0064341 | A1 | 3/2016 | Yap et al. | |
| 2017/0243841 | A1 | 8/2017 | Ko et al. | |

FOREIGN PATENT DOCUMENTS

| | | |
|---|---|---|
| CN | 206558495 U | 10/2017 |
| EP | 2892077 A1 | 7/2015 |
| JP | 2006-269594 A | 10/2006 |
| KR | 10-2012-0045639 A | 5/2012 |
| KR | 10-2017-0071826 A | 6/2017 |
| TW | 201304620 A1 | 1/2013 |

\* cited by examiner

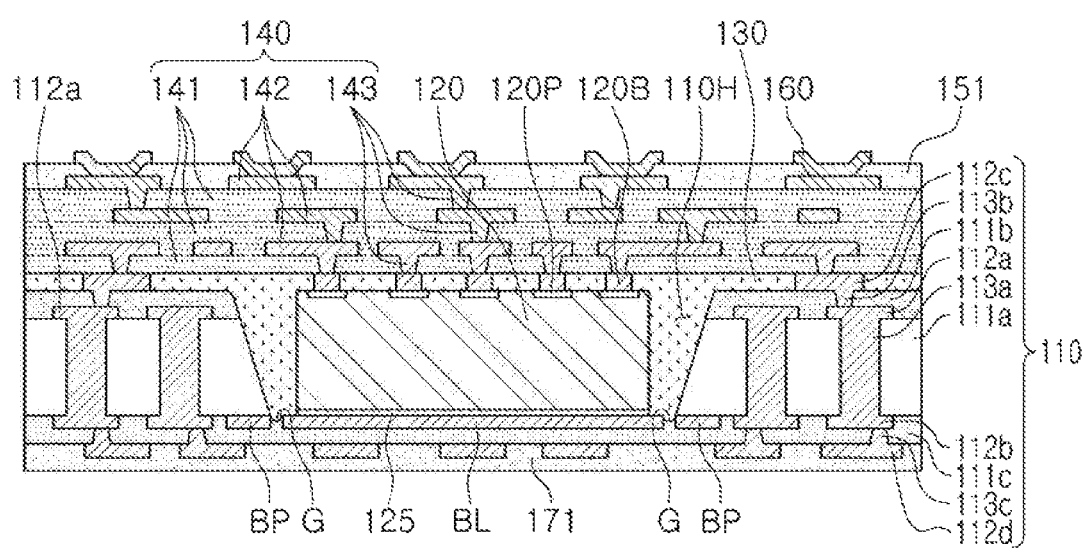
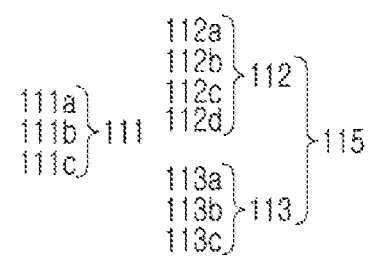
FIG. 13D

FAN-OUT SEMICONDUCTOR PACKAGE

CROSS-REFERENCE TO RELATED APPLICATION(S)

This application claims benefit of priority to Korean Patent Application Nos. 10-2017-0162707 filed on Nov. 30, 2017 and 10-2018-0028218 filed on Mar. 9, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

SUMMARY

An aspect of the present disclosure may provide a semiconductor package in which a recess portion having a blind form of which only one surface is opened is formed in a frame and a redistribution structure is implemented on the other surface of the frame, instead of implementing a separate backside redistribution layer on an inactive surface of a semiconductor chip.

An aspect of the present disclosure may also provide a fan-out semiconductor package in which a frame having a blind recess portion is introduced and a profile of a wall of the blind recess portion may be controlled.

According to an aspect of the present disclosure, a fan-out semiconductor package may be provided, in which a profile of a wall of a recess portion is controlled by a guide pattern formed in a frame.

According to an aspect of the present disclosure, a fan-out semiconductor package may include: a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion and a stopper layer disposed on a bottom surface of the recess portion; a semiconductor chip disposed in the recess portion and having connection pads, an active surface on which the connection pads are disposed, and an inactive surface opposing the active surface and disposed on the stopper layer; an encapsulant covering at least portions of the semiconductor chip and filling at least portions of the recess portion; a connection member disposed on the frame and the active surface of the semiconductor chip and including a redistribution layer electrically connecting the plurality of wiring layers of the frame and the connection pads of the semiconductor chip to each other; and a guide pattern disposed adjacent to a wall of the recess portion and disposed in the frame. An edge of the bottom surface of the recess portion may have a groove portion.

BRIEF DESCRIPTION OF DRAWINGS

The above and other aspects, features, and advantages of the present disclosure will be more clearly understood from the following detailed description taken in conjunction with the accompanying drawings, in which:

FIGS. 13A through 13E are schematic cross-sectional views illustrating processes of manufacturing the fan-out semiconductor package of FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
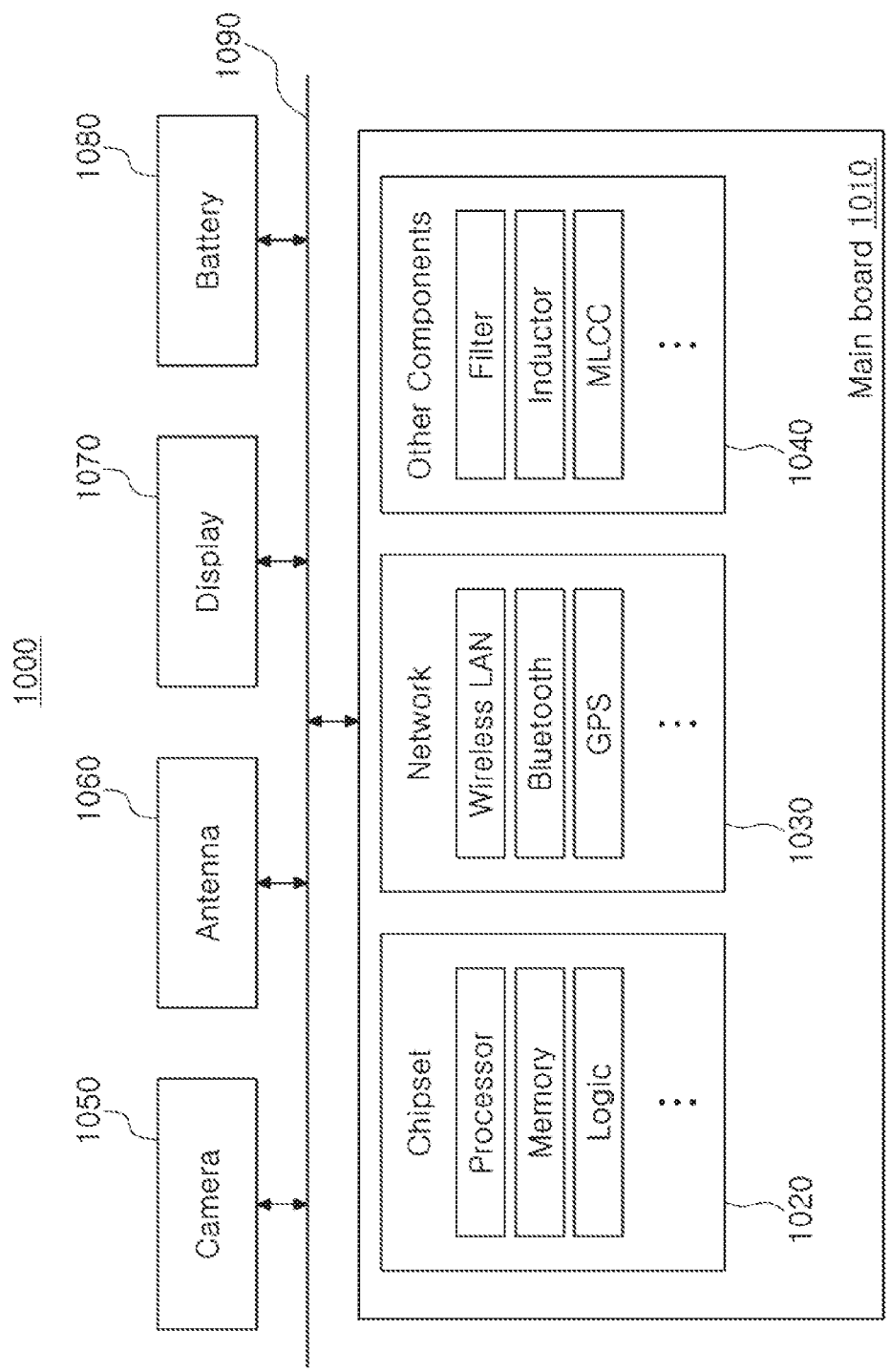
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, amultilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
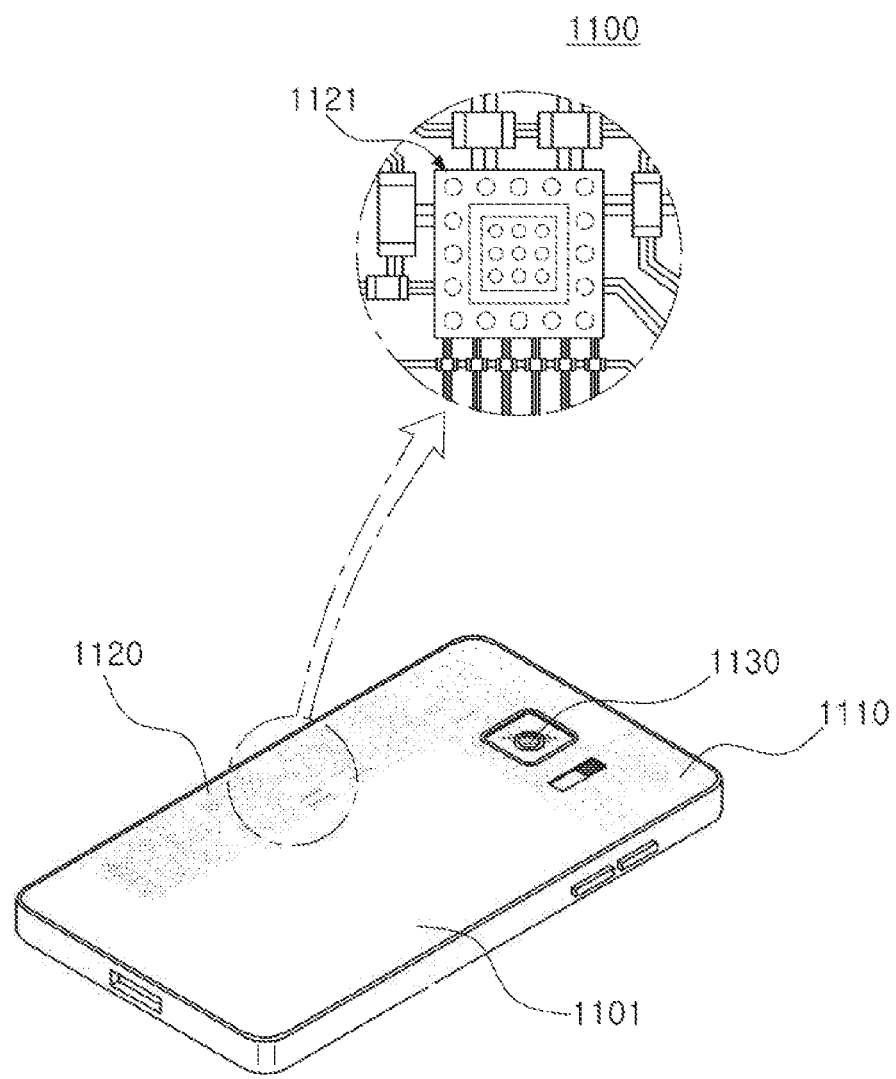
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
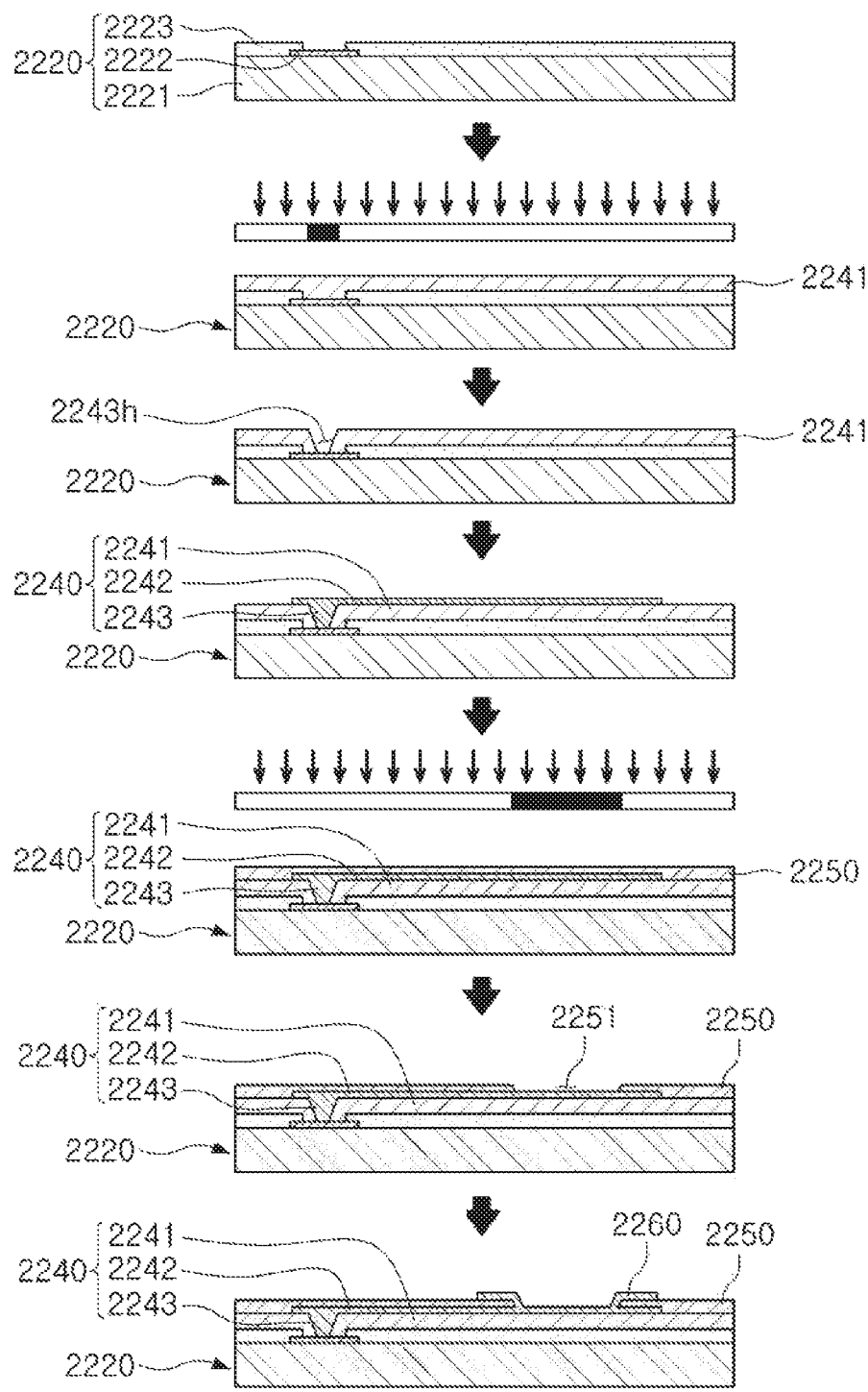
FIG. 4 is schematic cross-sectional views illustrating a packaging process of a fan-in semiconductor package.

FIG. 4 is schematic cross-sectional views illustrating a packaging process of a fan-in semiconductor package.

Figure 3:
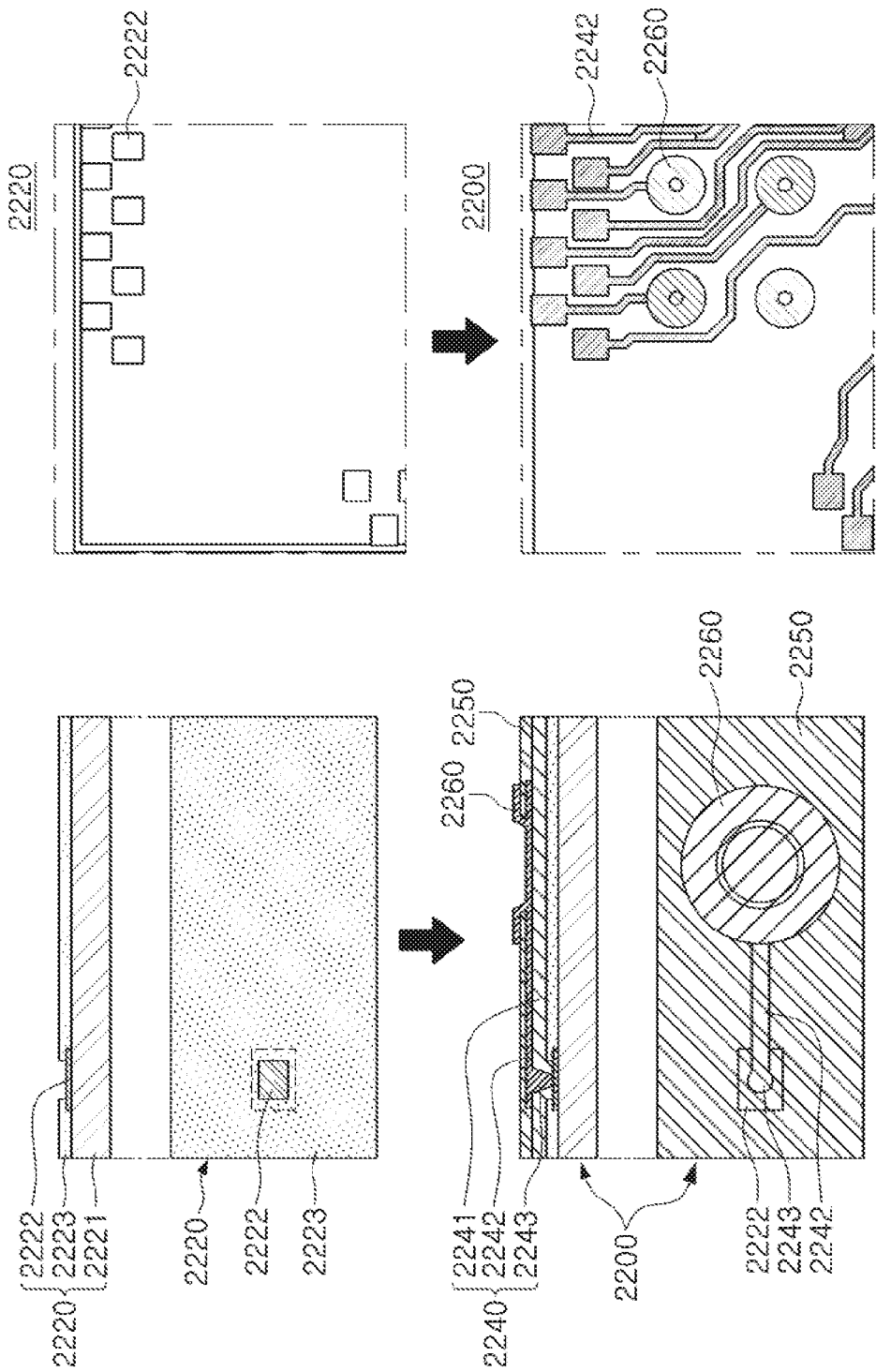
FIGS. 3A and 3B are schematic cross-sectional views illustrating states of a fan-in semiconductor package before and after being packaged.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
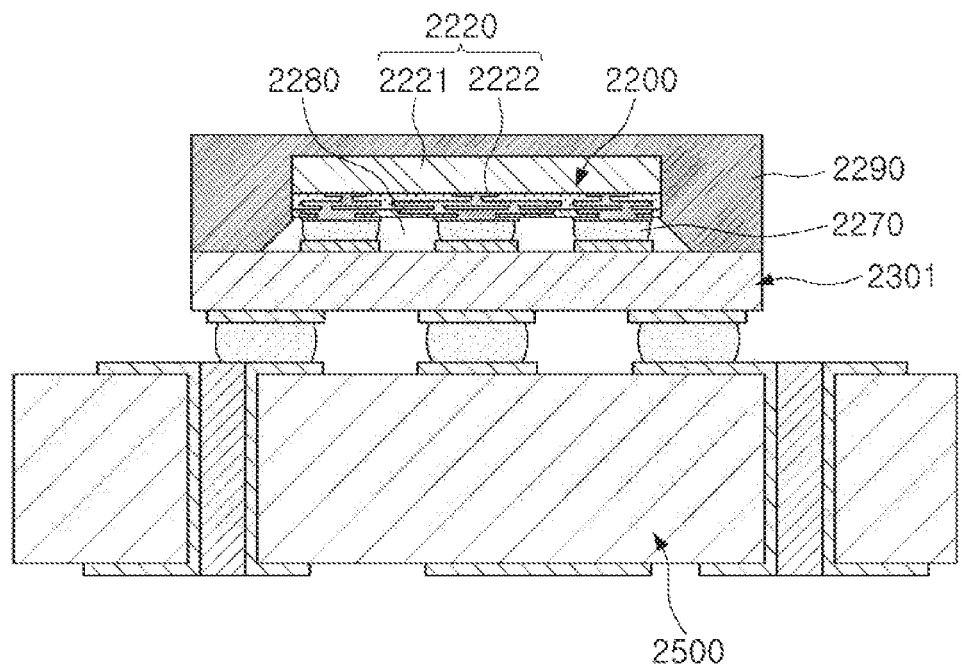
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
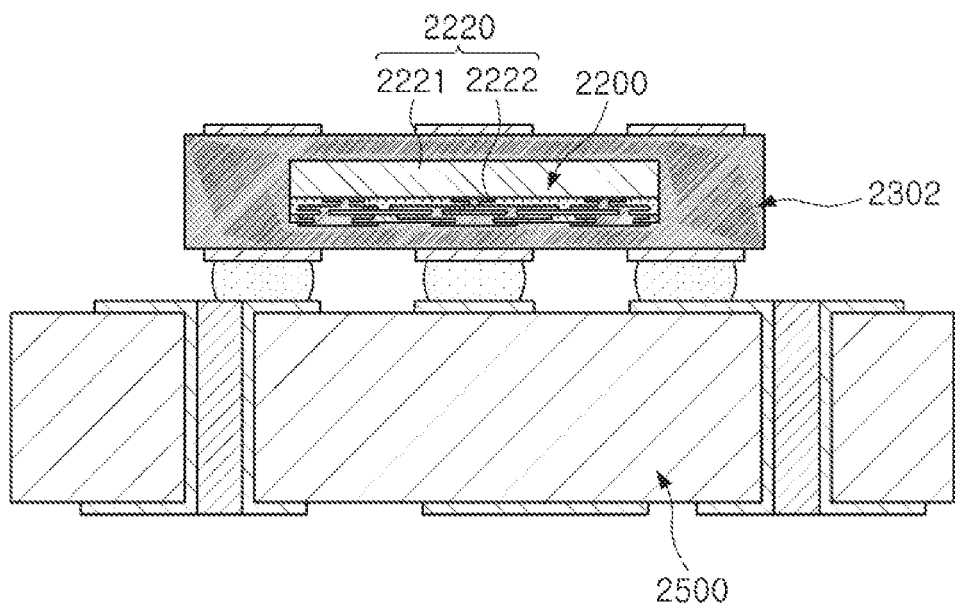
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, ball-shaped low melting point metals 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
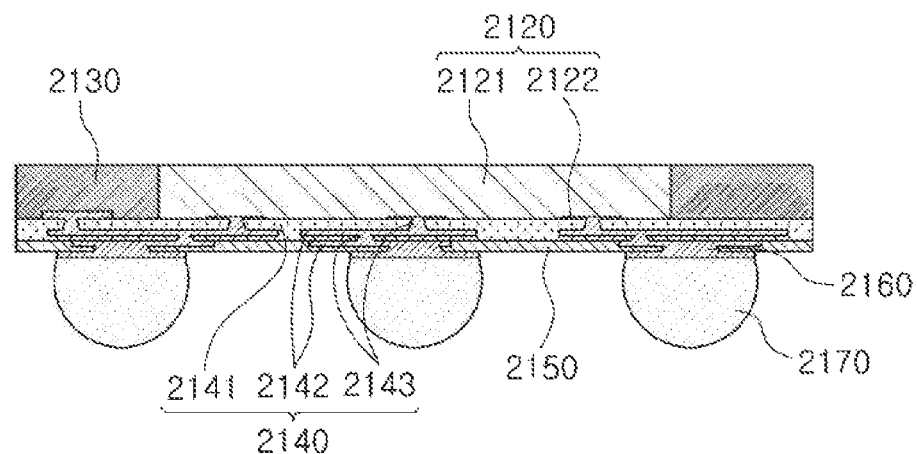
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Low melting point metals 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become to the semiconductor chip.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
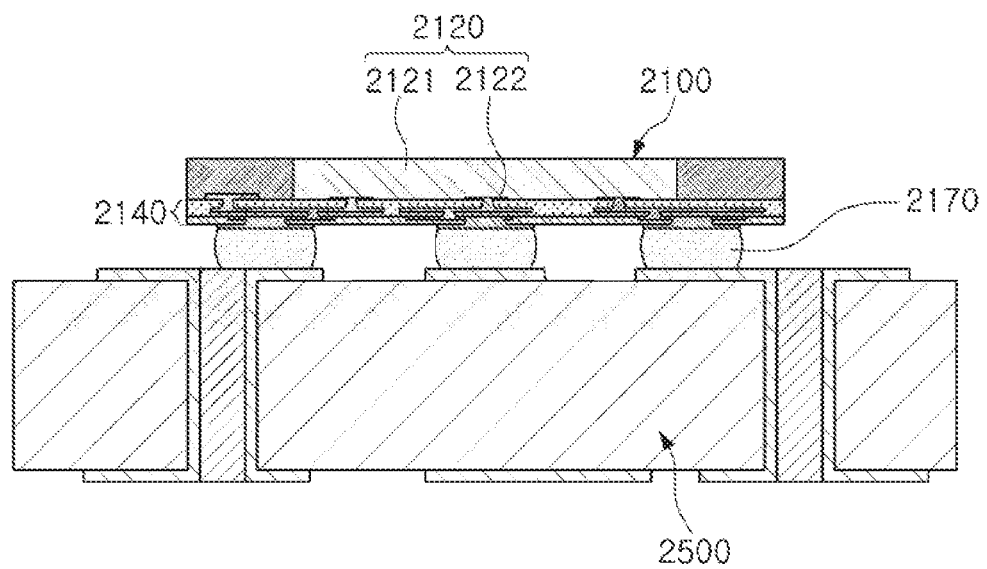
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metals 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package having a guide pattern capable of controlling a profile of a wall of a recess portion will hereinafter be described in detail with reference to the accompanying drawings.

Figure 9:
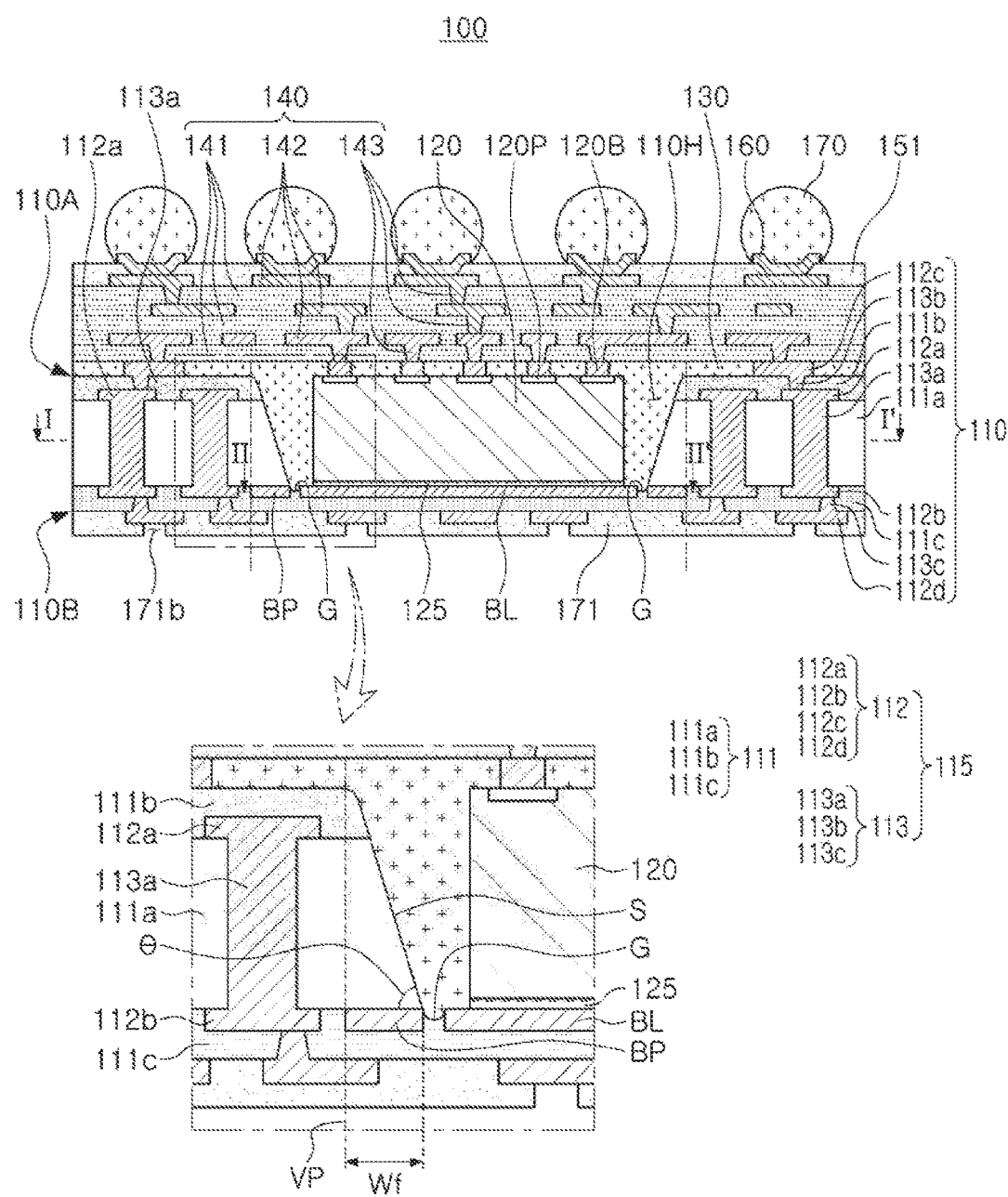
FIG. 9 is a schematic cross-sectional view illustrating a fan-out semiconductor package according to an exemplary embodiment in the present disclosure.

FIG. 9 is a schematic cross-sectional view illustrating a fan-out semiconductor package according to an exemplary embodiment in the present disclosure.

Figure 10A:
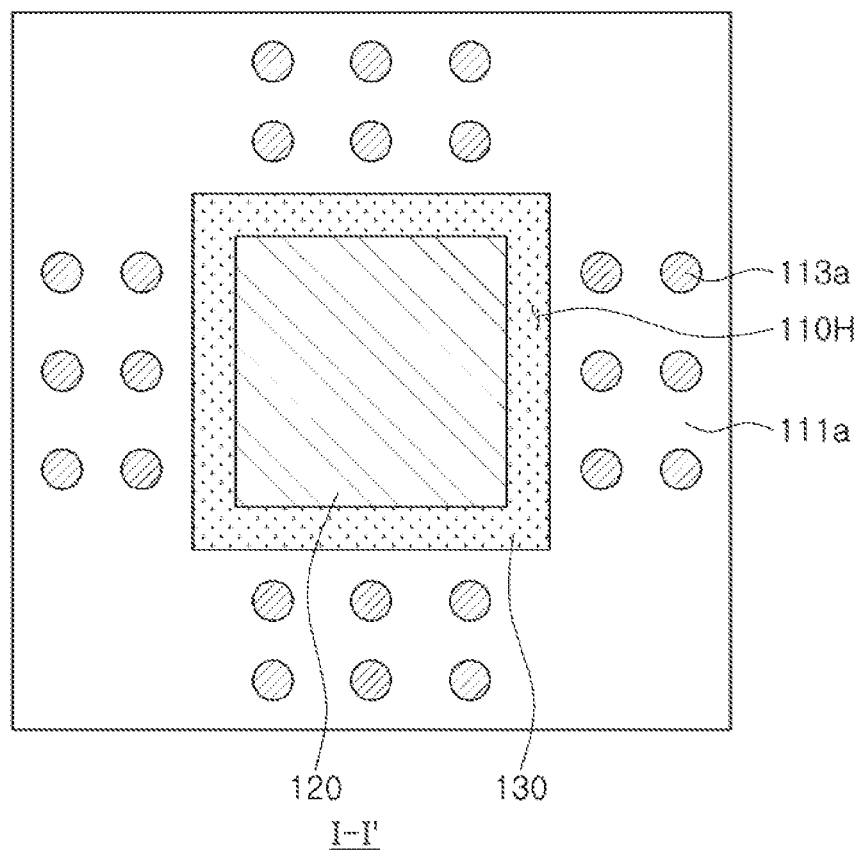
FIGS. 10A and 10B are, respectively, schematic plan views taken along line I-I' and line II-II' of the fan-out semiconductor package of FIG. 9.
Figure 10B:
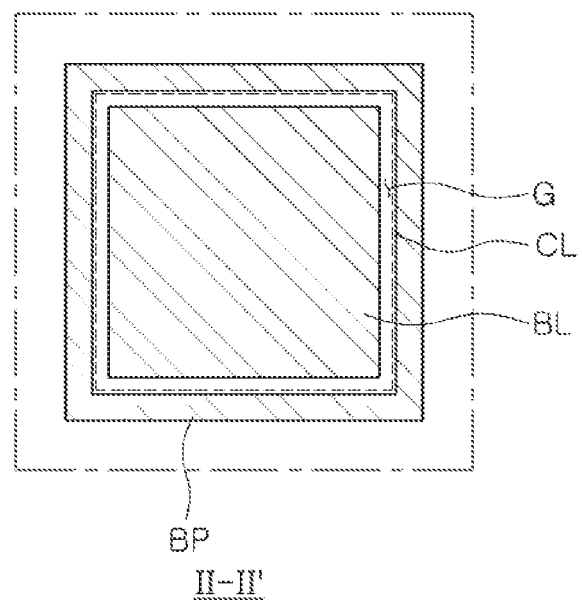

FIGS. 10A and 10B are, respectively, schematic plan views taken along line I-I' and line II-II' of the fan-out semiconductor package of FIG. 9.

Referring to FIG. 9, a fan-out semiconductor package 100 according to an exemplary embodiment in the present disclosure may include a frame 110 having a first surface 110A in which a recess portion 110H is formed and a second surface 110B opposing the first surface 110A, a stopper layer BL disposed on a bottom surface of the recess portion 110H, a semiconductor chip 120 disposed on the stopper layer BL, and an encapsulant 130 filling at least portions of the recess portion 110H and covering the semiconductor chip 120.

The semiconductor chip 120 may have an active surface having connection pads 120P disposed thereon and an inactive surface opposing the active surface, and the inactive surface of the semiconductor chip 120 may be attached to the stopper layer BL by an adhesive member 125. For example, the adhesive member 125 may be any known adhesive member such as a die attach film (DAF).

The frame 110 according to the present exemplary embodiment may include a first insulating layer 111a corresponding to a core layer, second and third insulating layers 111b and 111c disposed on opposite surfaces of the first insulating layer 111a, respectively, and a wiring structure 115 connecting the first surface 110A and the second surface 110B to each other. The wiring structure 115 may include connection via layers 113 and wiring layers 112 electrically connected to each other through the connection via layers 113.

The fan-out semiconductor package 100 according to the present exemplary embodiment may further include a connection member 140 disposed on the first surface 110A of the frame 110. The connection member 140 may include redistribution structures 142 and 143 connected to the wiring structure 115 and the connection pads 120P. The redistribution structures may include connection vias 143 and redistribution layers 142 electrically connected to each other through the connection vias 143. Metal bumps 120B may be formed on the connection pads 120P of the semiconductor chip 120, and the connection pads 120P and the connection vias 143 of the redistribution structures may be connected to each other by the metal bumps 120B exposed on a surface of the encapsulate 130.

The fan-out semiconductor package 100 according to the present exemplary embodiment may further include a first passivation layer 151 disposed on the connection member 140 and a second passivation layer 171 disposed on the second surface of the frame 110. The first passivation layer 151 may have openings exposing partial regions of the redistribution 142. Underbump metal layers 160 may be disposed in the openings of the first passivation layer 151 to be connected to the partial regions of the redistribution layer 142. Electrical connection structures 170 may be disposed on the underbump metal layers 160 to be electrically connected to the redistribution layer 142 through the underbump metal layers 160.

The recess portion 110H according to the present exemplary embodiment may have a blind recess portion structure in which it is opened in the first surface 110A of the frame 110 and is closed in the second surface 110B of the frame 110.

The recess portion 110H may be formed by selectively applying an etching process such as a sandblast process to the first surface 110A of the frame 110. In this process, the stopper layer BL may be used in order to etch the frame 110 up to a determined position. The stopper layer BL may define the bottom surface of the recess portion 110H. The stopper layer BL may be formed of a material having an etch rate lower than that of the insulating layers of the frame 110. For example, the stopper layer BL may include a metal such as copper (Cu). In the present exemplary embodiment, the stopper layer BL may be a metal pattern formed together with a wiring layer (that is, a second wiring pattern 112b) of the wiring structure 115 disposed on the same level.

In another example, the stopper layer BL is not limited to including the metal, but may include an insulating material. For example, the stopper layer BL may be a photosensitive polymer such as a dry film photoresist (DFR).

The fan-out semiconductor package 100 according to the present exemplary embodiment may include a guide pattern BP disposed in the frame 110 along an edge of the bottom surface of the recess portion 110H. The pattern BP may be used as an etching barrier structure for forming the recess portion together with the stopper layer BL described above.

The guide pattern BP according to the present exemplary embodiment may be used to control a profile, particularly, an angle of inclination θ of a tapered wall S of the recess portion 110H. A width Wf of an inclined region in relation to a vertical line of an upper end of the recess portion 110H may be defined by the angle of inclination θ of the wall S of the recess portion 110H. When the width Wf of the inclined region is increased, a wider area needs to be etched in an upper region of the recess portion 110H in order to secure a desired seating space (that is, an area of the bottom surface of the recess portion 110H). Therefore, a region for forming the wiring structure 115 of the frame 110 in the vicinity of the upper region of the recess portion 110H becomes narrow.

As described above, the width Wf of the inclined region of the wall S of the recess portion may determine a mounting defective rate of the semiconductor chip 120 as well as a degree of freedom of a design of the wiring structure 115 in the vicinity of the upper region of the recess portion 110H.

However, generally, in a process of forming the recess portion 110H by the etching process such as the sandblast process, a slope of the wall S of the recess portion may be initially steep, and may be gentle at a lower portion of the wall S of the recess portion due to a rapid decrease in processability when an etching depth becomes close to the stopper layer BL. In this case, the seating space (that is, the area of the bottom surface of the recess portion) becomes narrow, such that a serious defect that the semiconductor chip 120 is put over the inclined region may occur.

In the present exemplary embodiment, the guide pattern BP may be disposed on the same level as that of the stopper layer BL and be disposed to be spaced apart from the stopper layer BL, and a spaced region may be disposed along the edge of the bottom surface of the recess portion 110H. In the spaced region, a region of the insulating layer of the frame 110 may be exposed. Therefore, a groove G may be formed in the exposed insulating layer.

In the process of forming the recess portion, processability may be increased in the spaced region disposed along the edge of the bottom surface of the recess portion as compared to a region in which the stopper layer BL is disposed. Resultantly, also in the lower portion of the wall S of the recess portion, an angle of inclination similar to that of an upper portion of the recess portion may be maintained.

The stopper layer BL and the guide pattern BP may be disposed on the same level as that of a second wiring layer 112b. In detail, the stopper layer BL and the guide pattern BP may be formed together with the second wiring layer 112b between the first and third insulating layers 111a and 111c, that is, on a surface of the first insulating layer 111a on which the second wiring layer 112b is disposed.

The stopper layer BL and the guide pattern BP may be formed of the same material. For example, the stopper layer BL and the guide pattern BP may include a metal such as copper (Cu). In the present exemplary embodiment, the stopper layer BL and the guide pattern BP may be metal patterns formed together with the second wiring pattern 112b by the same process.

The guide pattern BP may be configured so as not to be directly connected to the second wiring layer 112b, but is not limited thereto. For example, the guide pattern BP may also be connected to a ground, and may also be partially connected to the stopper layer BL (see FIG. 11B).

FIG. 10B illustrates a cross section taken along line II-II' of the fan-out semiconductor package 100, and illustrates the bottom surface of the recess portion and the surrounding region of the bottom surface.

Referring to FIG. 10B, the stopper layer BL described above may be disposed in a central region of the bottom surface of the recess portion, and the guide pattern BP may be disposed in the frame 110 along the edge CL of the bottom surface of the recess portion.

An outer boundary of the spaced region in which the processability is increased may be defined by the guide pattern BP. The edge CL of the bottom surface of the recess portion 110H may be substantially determined by the guide pattern BP. Referring to FIGS. 9 and 10B, the frame 110 may have the groove G formed along the edge CL of the bottom surface of the recess portion 110H. The groove G, which is an excessively etched portion, may be disposed in the spaced region between the stopper layer BL and the guide pattern BP. The groove G may have a ring shape forming a closed loop along the edge of the bottom surface of the recess portion 110H, but is not limited thereto.

As in the present exemplary embodiment, the guide pattern BP may be disposed in the frame so that it is adjacent to the edge, but is not externally exposed. However, the guide pattern BP is not limited thereto. In another exemplary embodiment, portions of the guide pattern BP may be exposed at the edge of the bottom surface of the recess portion 110H. This may be determined by an etching level for forming the recess portion 110H.

As described above, a size of the bottom surface of the recess portion 110H and/or the width Wf of the inclined region of the recess portion may be controlled by a position of the guide pattern BP and a width of the spaced region. In detail, the profile of the wall of the recess portion of which the angle of inclination is substantially a right angle and the width Wf of the inclined region is very short may be obtained by setting the position of the guide pattern BP to correspond to an open region of a mask 250 (see FIG. 12D) at the time of forming the recess portion 110H and sufficiently securing the spaced region.

The respective components included in the fan-out semiconductor package 100 according to the present exemplary embodiment will hereinafter be described in more detail.

The frame 110 may reinforce rigidity of the fan-out semiconductor package 100 depending on certain materials, and serve to assist in uniformity of a thickness of the encapsulant 130. The frame 110 may have the wiring structure 115 including first to fourth wiring layers 112a, 112b, 112c, and 112d and first to third connection via layers 113a, 113b, and 113c. The frame 110 may include the third wiring layer 112c disposed on the inactive surface of the semiconductor chip 120, and may have a blind type recess portion 110H to thus provide a backside redistribution layer for the semiconductor chip 120 without performing a process of forming a separate backside redistribution layer.

The frame 110 may include the first insulating layer 111a, the first and second wiring layers 112a and 112b disposed on the opposite surfaces of the first insulating layer 111a, respectively, the first connection via layers 113a penetrating through the first insulating layer 111a and connecting the first and second wiring layers 112a and 112b to each other. In addition, the frame 110 may include the second insulating layer 111b disposed on one surface of the first insulating layer 111a and covering the first wiring layer 112a, the third insulating layer 111c disposed on the other surface of the first insulating layer 111a and covering the second wiring layer 112b, the third wiring layer 112c disposed on the second insulating layer 111b, the fourth wiring layer 112d disposed on the third insulating layer 111c, the second connection via layers 113b penetrating through the second insulating layer 111b and electrically connecting the first and third wiring layers 112a and 112c to each other, and the third connection via layers 113c penetrating through the third insulating layer 111c and electrically connecting the second and fourth wiring layers 112b and 112d to each other.

In the present exemplary embodiment, the recess portion 110H may penetrate through the first and second insulating layers 111a and 111b, but may not penetrate through the third insulating layer 111c due to the stopper layer BL. The first and second insulating layers 111a and 111b may provide the walls of the recess portion 110H, and the stopper layer BL may be disposed on the same level as that of the guide pattern BP and the second wiring layer 112b on the third insulating layer 111c.

The first to third insulating layers 111a, 111b, and 111c may include a thermosetting resin such as an epoxy resin or a thermoplastic resin such as a polyimide resin. In a specific example, each of the first to third insulating layers 111a, 111b, and 111c may include a resin mixed with an inorganic filler or impregnated together with an inorganic filler in a glass fiber, or the like, for example, prepreg, Ajinomoto Build up Film (ABF), FR-4, Bismaleimide Triazine (BT), or the like. When a material having high rigidity, such as prepreg including a glass fiber, or the like, is used as a material of each of the first to third insulating layers 111a, 111b, and 111c, the frame 110 may be utilized as a support member for controlling warpage of the fan-out semiconductor package 100.

The first insulating layer 111a may have a thickness greater than those of the second and third insulating layers 111b and 111c. The first insulating layer 111a may basically be relatively thick in order to maintain rigidity, and the second insulating layer 111b and the third insulating layer 111c may be introduced to form a larger number of wiring layers 112c and 112d. That is, the first insulating layer 111a may serve as a core insulating layer, and the second and third insulating layers 111b and 111c may serve as build-up insulating layers for performing build-up in different directions, respectively. The second and third insulating layers 111b and 111c may include a material different from that of the first insulating layer 111a. For example, the first insulating layer 111a may be, for example, prepreg in which an insulating resin is impregnated together with an inorganic filler in a glass fiber, and the second and third insulating layers 111b and 111c may be an ABF or a PID film including an inorganic filler and an insulating resin. However, the materials of the first insulating layer 111a and the second and third insulating layers 111b and 111c are not limited thereto. The first connection via layer 113a penetrating through the first insulating layer 111a may have a diameter greater than those of the second and third connection via layers 113b and 113c.

The first to fourth wiring layers 112a, 112b, 112c, and 112d may redistribute the connection pads 120 of the semiconductor chip 120 together with the redistribution structures 142 and 143 of the connection member. For example, the first to fourth wiring layers 112a, 112b, 112c, and 112d may include a conductive material such as copper (Cu), aluminum (Al), silver (Ag), tin (Sn), gold (Au), nickel (Ni), lead (Pb), titanium (Ti), or alloys thereof. The first to fourth wiring layers 112a, 112b, 112c, and 112d may perform various functions depending on designs of corresponding layers. For example, the first to fourth wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like.

Thicknesses of the first to fourth wiring layers 112a, 112b, 112c, and 112d may be greater than those of the redistribution layers 142 of the connection member 140. Since the wiring structure 115 of the frame 110 is formed by a substrate process, the wiring structure 115 may be formed to have a relatively large size, and since the redistribution structures 142 and 143 of the connection member 140 are formed by a semiconductor process, the redistribution structures 142 and 143 may be formed to have relatively small sizes.

The first to third connection via layers 113a, 113b, and 113c may electrically connect the first to fourth wiring layers 112a, 112b, 112c, and 112d formed on different layers to each other, resulting in an electrical path in the frame 110. The first to third connection via layers 113a, 113b, and 113c may be formed of a conductive material. The first connection via layer 113a may have a cylindrical shape or a hourglass shape, and the second and third connection via layers 113b and 113c may have tapered shapes of which directions are opposite to each other in relation to the first insulating layer 111a.

The semiconductor chip 120 may be an integrated circuit (IC) provided in an amount of several hundred to several million or more elements integrated in a single chip. The semiconductor chip 120 may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. In addition, the semiconductor chip 120 may be a memory chip such as a volatile memory (such as a DRAM), a non-volatile memory (such as a ROM), a flash memory, or the like, but is not limited thereto.

The semiconductor chip 120 may be formed on the basis of an active wafer, and a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer exposing the connection pads 120P may be formed on the body, and may be an oxide film, a nitride film, or the like, or a double layer of an oxide layer and a nitride layer. An insulating layer, and the like, may also be further disposed in required positions. The semiconductor chip 120 may be a bare die, but may include a redistribution layer formed on the active surface thereof, if necessary.

The semiconductor chip 120 may include the metal bumps 120B each disposed on the connection pads 120P and connected to the connection pads 120P. Each of the metal bumps 120B may be formed of a metal such as copper (Cu) or may be formed of a low melting point metal such as Sn—Au—Cu. The encapsulant 130 according to the present exemplary embodiment may have an upper surface substantially coplanar with an upper surface of the third wiring layer 112c of the frame 110 and upper surfaces of the metal bumps 120B of the semiconductor chip 120 (see FIG. 13B). In some cases, upper surfaces of the second connection via layers 113b of the frame 110 may be exposed as a grinding result, such that the encapsulant 130 may have an upper surface substantially coplanar with upper surfaces of the metal bumps 120B and the upper surfaces of the third wiring layer 112c. The encapsulant 130 may protect the frame 110, the semiconductor chip 120, and the like. An encapsulation form of the encapsulant 130 is not particularly limited, but may be a form in which the encapsulant 130 packs the frame 110 and the semiconductor chip 120. For example, the encapsulant 130 may cover the first surface 110A of the frame 110 and the active surface of the semiconductor chip 120, and fill spaces between the walls S of the recess portion 110H and side surfaces of the semiconductor chip 120. The encapsulant 130 may fill the recess portion 110H to thus serve as an adhesive and reduce buckling of the semiconductor chip 120 depending on certain materials.

The encapsulant 130 may include an insulating material, for example, a thermosetting resin such as an epoxy resin or a thermoplastic resin such as a polyimide resin. In a specific example, the encapsulant 130 may include a resin mixed with an inorganic filler or impregnated together with an inorganic filler in a glass fiber. For example, prepreg, ABF, FR-4, BT, or the like, may be used as a material of the encapsulant 130. Alternatively, the encapsulant 130 may include a photoimagable encapsulant (PIE) resin.

The connection member 140 may redistribute the connection pads 120P of the semiconductor chip 120, and may electrically connect the first to fourth wiring layers 112a, 112b, 112c, and 112d of the frame 110 to the connection pads 120P of the semiconductor chip 120. Several tens to several millions of connection pads 120P of the semiconductor chip 120 having various functions may be redistributed by the connection member 140, and may be physically or electrically externally connected through the electrical connection structures 170 depending on the functions. The connection member 140 may include insulating layers 141 disposed on the frame 110 and the active surface of the semiconductor chip 120, the redistribution layers 142 disposed on the insulating layers 141, and the connection vias 143 penetrating through the insulating layers 141 and connecting the connection pads 120P and the third wiring layer 112c to a redistribution layer 142 adjacent to the connection pads 120P and the third wiring layer 112c or connecting the redistribution layers 142 formed on different layers to each other.

A material of each of the insulating layers 141 may be a photosensitive insulating material such as a PID resin, in addition to the insulating material as described above. When the insulating layer 141 has photosensitive properties, the insulating layer 141 may be formed to have a smaller thickness, and a fine pitch of the connection via 143 may be achieved more easily. The insulating layers 141 may be photosensitive insulating layers including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 of the connection member 140 may serve to substantially redistribute the connection pads 120P. Each of the redistribution layers 142 may include, for example, a conductive material such as copper (Cu), aluminum (Al), silver (Ag), tin (Sn), gold (Au), nickel (Ni), lead (Pb), titanium (Ti), or alloys thereof. The redistribution structures 142 and 143 may perform various functions depending on designs of corresponding layers, and may include, for example, ground patterns, power patterns, and signal patterns, and the like.

The connection vias 143 may electrically connect the redistribution layers 142, the connection pads 120P, and the third wiring layer 112c formed on different layers to each other, resulting in an electrical path in the fan-out semiconductor package 100.

The first and second passivation layers 151 and 171 may protect the connection member 140 and the frame 110 from external physical or chemical damage. The first passivation layer 151 may have the openings exposing at least portions of the redistribution layer 142 of the connection member 140. The second passivation layer 171 may have openings 171b exposing at least portions of the fourth wiring layer 112d of the frame 110. The numbers of openings formed in the first and second passivation layers 151 and 171 may be several tens to several millions. A material of each of the first and second passivation layers 151 and 171 may be a solder resist, in addition to the insulating material as described above.

The underbump metal layers 160 may improve connection reliability of the electrical connection structures 170 to improve board level reliability of the fan-out semiconductor package 100. The underbump metal layers 160 may be connected to the redistribution layer 142 of the connection member 140 exposed through the openings of the first passivation layer 151. The underbump metal layers 160 may be formed in the openings of the first passivation layer 151 by any known metallization method using any known conductive material such as a metal, but are not limited thereto.

The electrical connection structures 170 may physically or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a low melting point metal such as an Sn—Al—Cu alloy. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less. When the electrical connection structures 170 are formed of a low melting point metal, the electrical connection structures 170 may cover side surfaces of the underbump metal layers 160 extending onto one surface of the first passivation layer 151, and connection reliability may be more excellent.

At least one of the electrical connection structures 170 may be disposed in a fan-out region. The fan-out region is a region except for the region in which the semiconductor chip 120 is disposed. A fan-out semiconductor package may have excellent reliability as compared to a fan-in semiconductor package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated, a metal film may be formed on the walls S of the recess portion 110H, if necessary, in order to dissipate heat or block electromagnetic waves. In addition, a plurality of semiconductor chips 120 performing functions that are the same as or different from each other may be disposed in the recess portion 110H, if necessary. In addition, a separate passive component such as an inductor, a capacitor, or the like, may be disposed in the recess portion 110H. For example, surface mounting technology (SMT) components such as an inductor or a capacitor may be disposed on surfaces of the first and second passivation layers 151 and 171.

The stopper layer BL according to the present exemplary embodiment may be used as a heat dissipation member dissipating heat generated from the semiconductor chip 120. If necessary, the stopper layer BL may be connected to a ground and be used as an electromagnetic interference (EMI) blocking member.

Figure 11A:
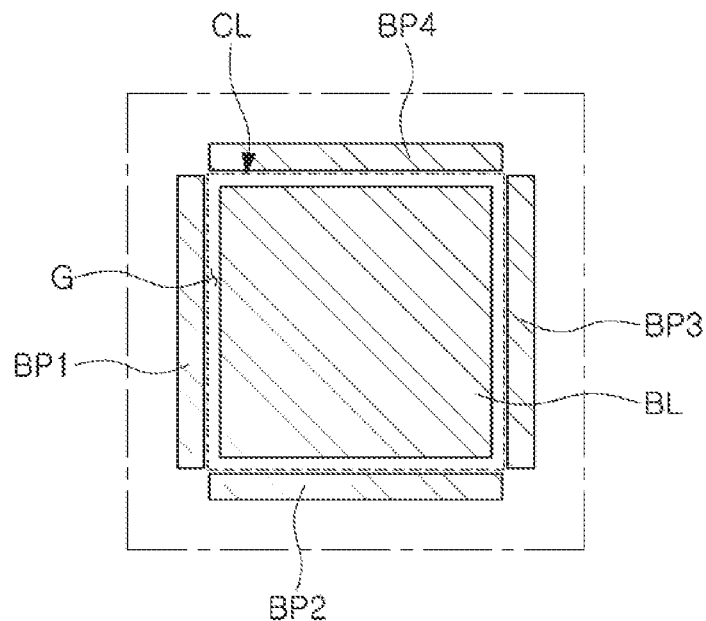
FIGS. 11A and 11B are schematic plan views illustrating other examples of a guide pattern that may be used in the fan-out semiconductor package of FIG. 9.

A case in which the guide pattern BP according to the present exemplary embodiment has a monolithic form is illustrated in FIG. 10B, but the guide pattern BP is not limited thereto. For example, the guide pattern BP may include a plurality of patterns. For example, the guide pattern BP may include four patterns BP1, BP2, BP3, and BP4 disposed at respective edges of the recess portion 110H having a rectangular cross section, as illustrated in FIG. 11A. Since the patterns BP1, BP2, BP3, and BP4 of the guide pattern BP are formed along the edge CL of the bottom surface of the recess portion except for corners, an effect similar to that of the guide pattern BP illustrated in FIG. 10B may be expected.

Figure 11B:
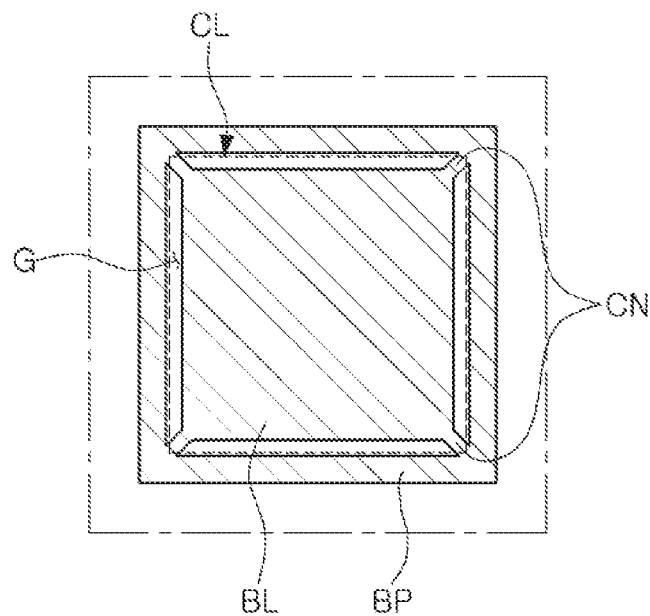

A case in which the guide pattern BP is completely separated from the stopper layer BL, that is, a case in which the guide pattern BP is physically spaced apart from the stopper layer BL is illustrated in FIG. 10B, but the guide pattern BP is not limited thereto. For example, the guide pattern BP may be partially connected to the stopper layer BL. For example, as illustrated in FIG. 11B, the guide pattern BP formed along the edge CL of the bottom surface of the recess portion may be connected to the stopper layer at the respective corners CN of the recess portion. In this case, the guide pattern BP, the stopper layer BL, and the respective corners CN may be an integral element having two or more slits surrounded by the guide pattern, the stopper layer, and the one or more connection portions.

Since the guide pattern BP and the stopper layer BL are spaced apart from each other by the two or more slits except for the corners CN to provide the spaced region therebetween, the groove G may be formed along the edge CL of the bottom surface of the recess portion to effectively control the profile of the lower portion of the wall S of the recess portion. In this case, the groove G may have a form of a plurality of grooves each formed in the edges of the bottom surface and corresponding to the two or more slits.

FIGS. 12A through 12E are schematic cross-sectional views illustrating processes of forming a frame of the fan-out semiconductor package of FIG. 9.

Figure 12A:
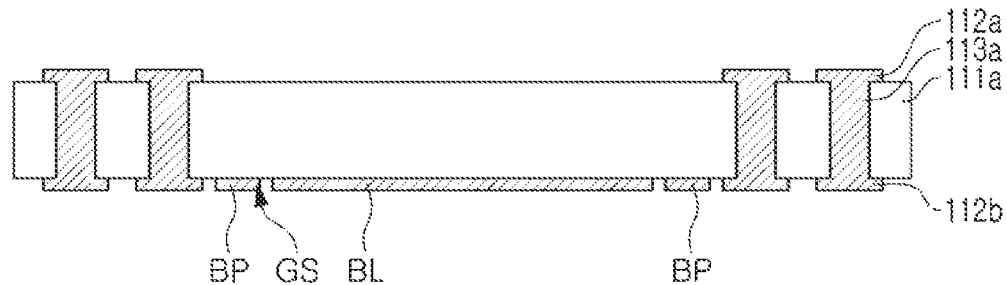
FIGS. 12A through 12E are schematic cross-sectional views illustrating processes of forming a frame of the fan-out semiconductor package of FIG. 9.

First, referring to FIG. 12A, the first insulating layer 111a may be prepared, the first and second wiring layers 112a and 112b and the first connection via layers 113a may be formed on and in the first insulating layer 111a, respectively, and the stopper layer BL and the guide pattern BP may be formed on a surface of the first insulating layer 111a on which the second wiring layer 112b is disposed. The first insulating layer 111a may be, for example, a copper clad laminate (CCL). Holes for the first connection via layers 113a may be formed using a mechanical drill and/or a laser drill. The first and second wiring layers 112a and 112b and the first connection via layers 113a may be formed by any known plating process. The stopper layer BL and the guide pattern BP may be formed on the surface of the first insulating layer 111a on which the second wiring layer 112b is disposed. In a subsequent process of forming a recess portion, the stopper layer BL may be used as an etching barrier determining a depth of the recess portion, and the guide pattern BP may be spaced apart from the stopper layer BL to serve to define a contour of the bottom surface of the recess portion. The spaced portion GS may serve to induce excessive etching in the latter half of etching to control the profile of the lower portion of the wall of the recess portion. The stopper layer BL and the guide pattern BP may be formed of the same material. For example, the stopper layer BL and the guide pattern BP may include a metal such as copper (Cu). In the present exemplary embodiment, the stopper layer BL and the guide pattern BP may be metal patterns formed together with the second wiring pattern 112b by the same process.

Figure 12B:
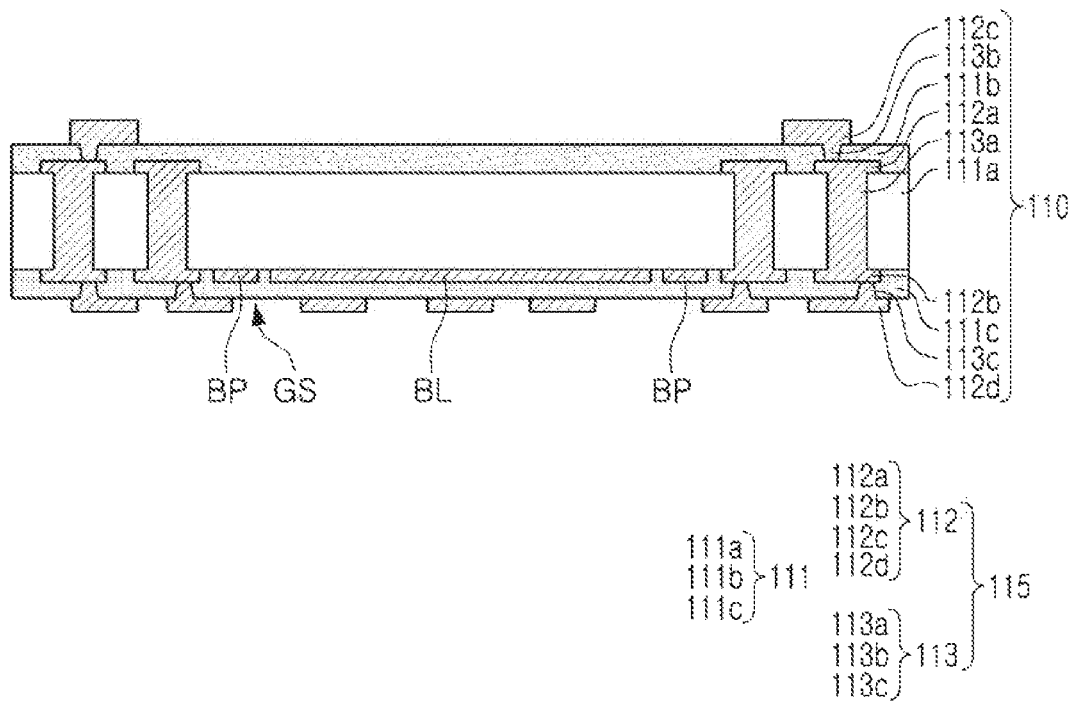

Then, referring to FIG. 12B, the second and third insulating layers 111b and 111c and a desired wiring structure 115 may be formed on the opposite surfaces of the first insulating layer 111a. In the present process, the second and third insulating layers 111b and 111c may be formed by laminating and hardening insulating films such as ABFs. The third and fourth wiring layers 112c and 112d and the second and third connection via layers 113b and 113c may be formed on and in the second and third insulating layers 111b and 111c, respectively, by a plating process. Holes for the second and third connection via layers 113b and 113c may be formed using a mechanical drill and/or a laser drill, similar to the holes for the first connection via layers 113a.

Figure 12C:
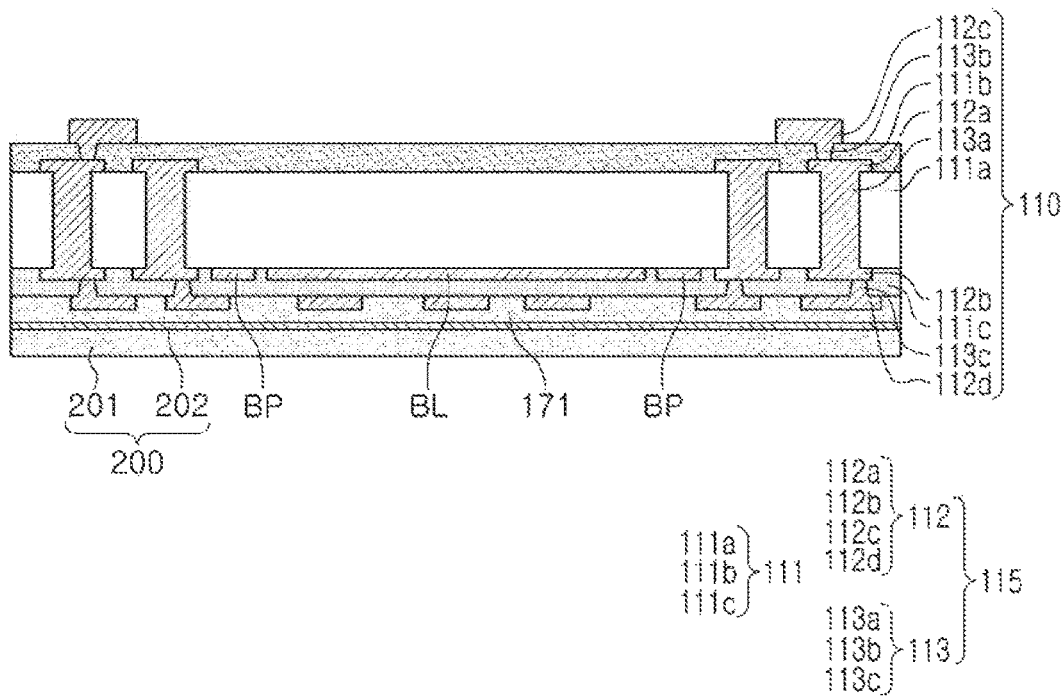

Then, referring to FIG. 12C, the second passivation layer 171 may be formed on the second surface 110B of the frame 110 prepared in the process described above, and a carrier film 200 may be attached to the second passivation layer 171. A material of the second passivation layer 171 may be a solder resist, in addition to the various insulating materials described above. The carrier film 200 may be disposed on the second surface 110B of the frame 110 on which the second passivation layer 171 is formed, and may be used as a support for treating the frame 110 in a subsequent process such as a process of forming a recess portion, or the like. The carrier film 200 according to the present exemplary embodiment may be a copper clad laminate such as a DCF including an insulating layer 201 and a metal layer 202.

Figure 12D:
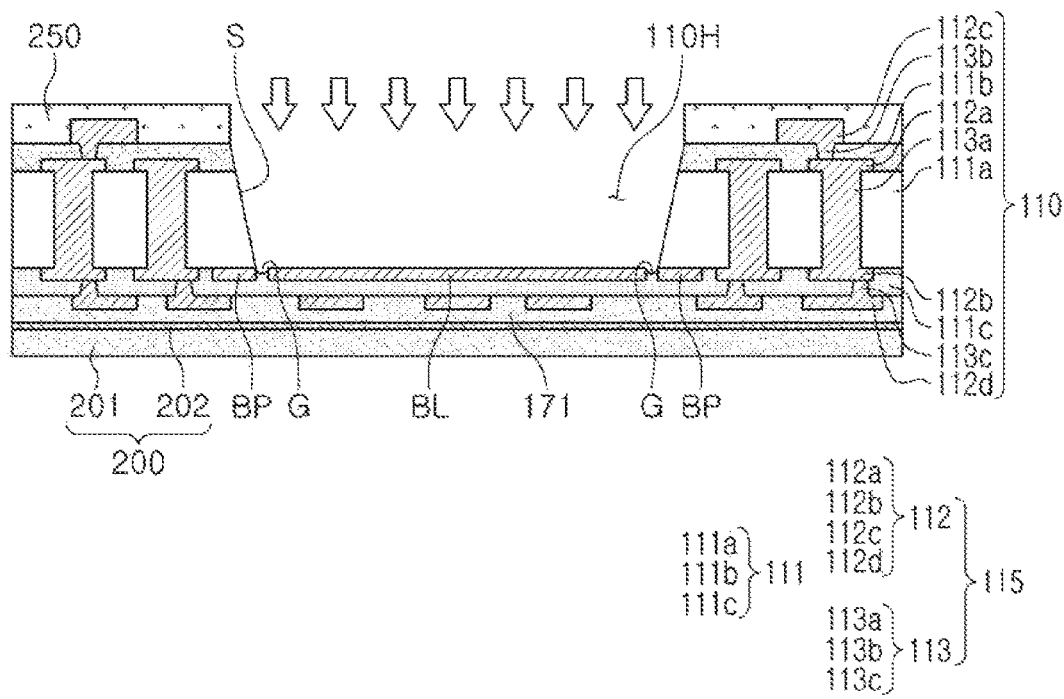

Then, referring to FIG. 12D, a mask layer 250 having an open region may be formed on the first surface 110A of the frame 110, and an etching process for forming the recess portion may be performed. A DFR may be formed on the first surface 110A of the frame 110 and be then patterned to form the mask layer 250 having the open region defining the recess portion. The recess portion 110H penetrating through the first and second insulating layers 111a and 111b may be formed by an etching process such as a sandblast process. In this case, the stopper layer BL may act as an etching stopper to define a depth of the recess portion 110H. The open region of the mask layer 250 may be set so that the surrounding region of the stopper layer BL, that is, the spaced region between the stopper layer BL and the guide pattern BP (for example, a region of the third insulating layer 111c) is exposed in the process (particularly, the latter half) of forming the recess portion. The guide pattern BP may be spaced apart from the stopper layer BL to define the contour of the bottom surface of the recess portion, and the spaced region may induce the excessive etching in the latter half of the etching. Resultantly, as in the present exemplary embodiment, the groove G may be formed. In this process, a large angle of inclination may also be maintained in the lower portion of the wall S of the recess portion, and the width Wf (see FIG. 9) of the inclined region may be decreased.

Figure 12E:
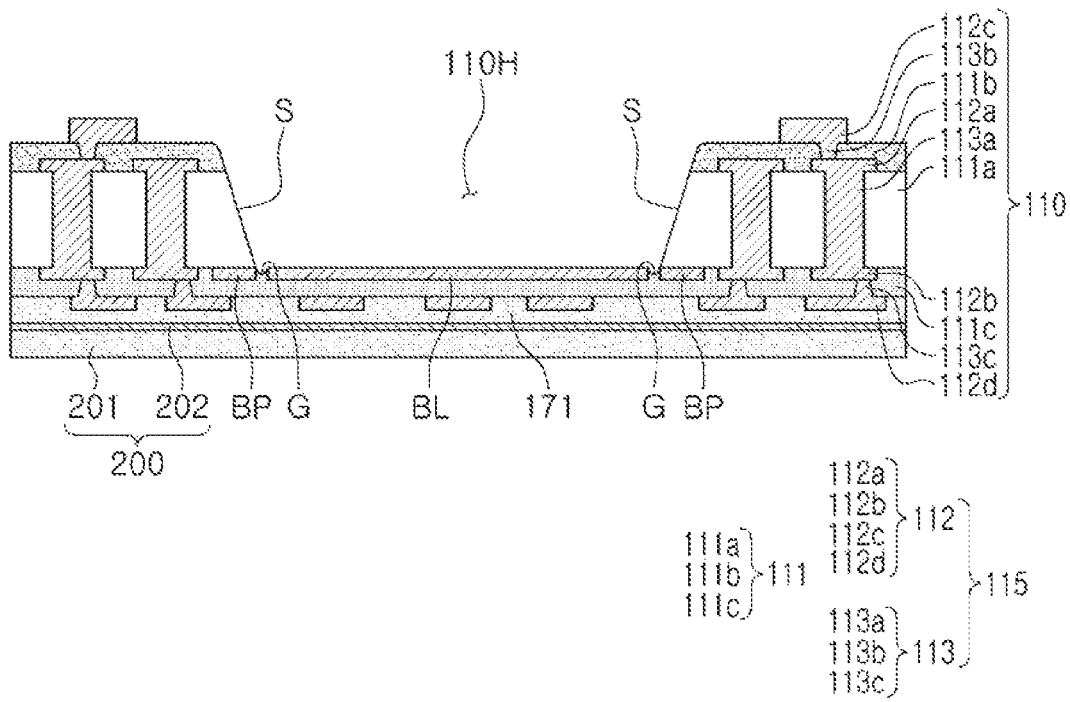

When the process of forming the recess portion ends, as illustrated in FIG. 12E, the mask layer 250 may be removed, and the frame 110 including the recess portion 110H and the wiring structure 115 may be provided. The recess portion 110H formed in the present exemplary embodiment may have the wall S having the large angle of inclination using the guide pattern BP and the stopper layer BL.

FIGS. 13A through 13E are schematic cross-sectional views illustrating processes of manufacturing the fan-out semiconductor package of FIG. 9.

The present manufacturing process may be understood as a process of manufacturing the fan-out semiconductor package using the frame manufactured in the previous process.

Figure 13A:
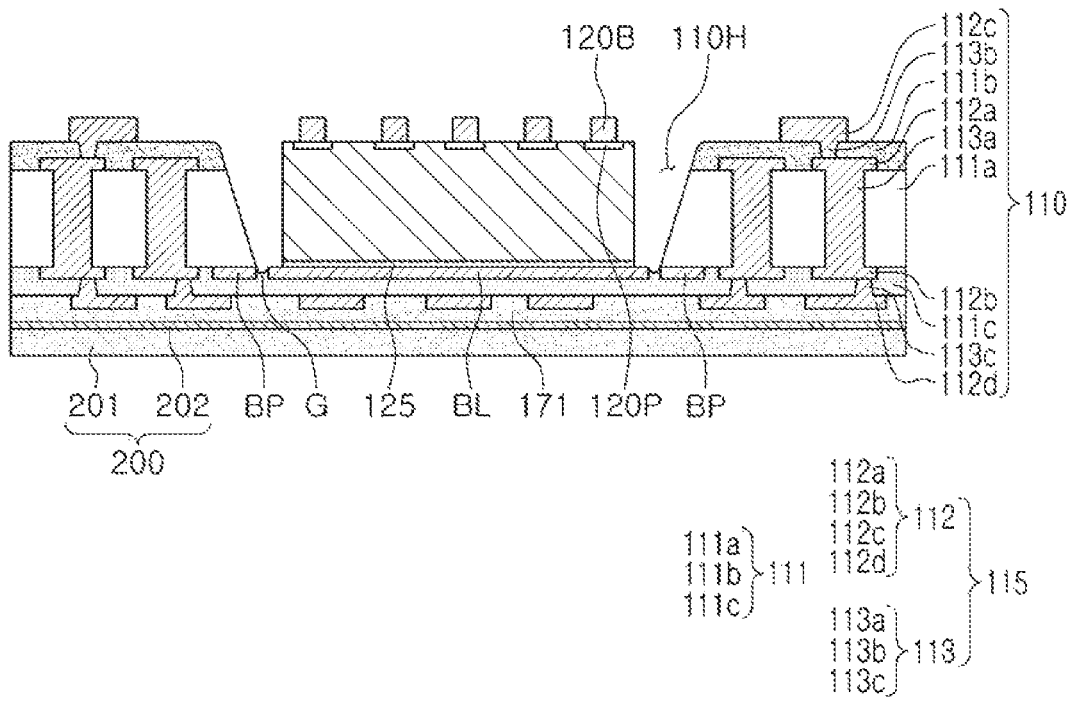

Referring to FIG. 13A, the semiconductor chip 120 may be disposed in the recess portion 110H and be attached to the stopper layer BL. The semiconductor chip 120 may be attached to the stopper layer BL using the adhesive member 125 such as the DAF. Meanwhile, the semiconductor chip 120 may be attached in a state in which the metal bumps 120B such as copper (Cu) pillars are formed on the connection pads 120P. The metal bumps 120B may be formed on a level above at least the first surface 110A of the frame 110.

Figure 13B:
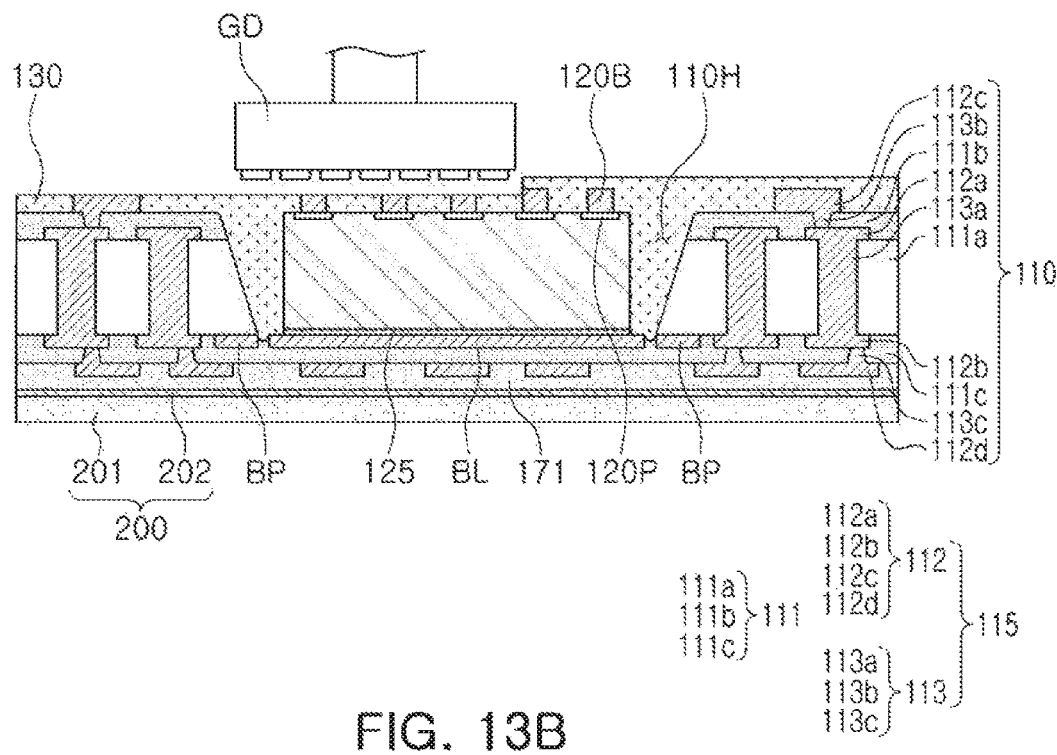

Then, referring to FIG. 13B, the first surface 110A of the frame 110 and the semiconductor chip 120 may be encapsulated using the encapsulant 130, and a grinding process may be performed so that the metal bumps 120B and the third wiring layer 112c are exposed. The encapsulants 130 may be formed by laminating and then hardening a film such as an ABF. The encapsulant 130 may be formed to cover at least the first surface 110A of the frame 110 and the metal bumps 120B. The metal bumps 120B and the third wiring layer 112c may be exposed on a surface of the encapsulant 130 by the present grinding process, and the surface of the encapsulant 130 and upper surfaces of the metal bumps 120B and the third wiring layer 112c may be substantially coplanar with each other.

Figure 13C:
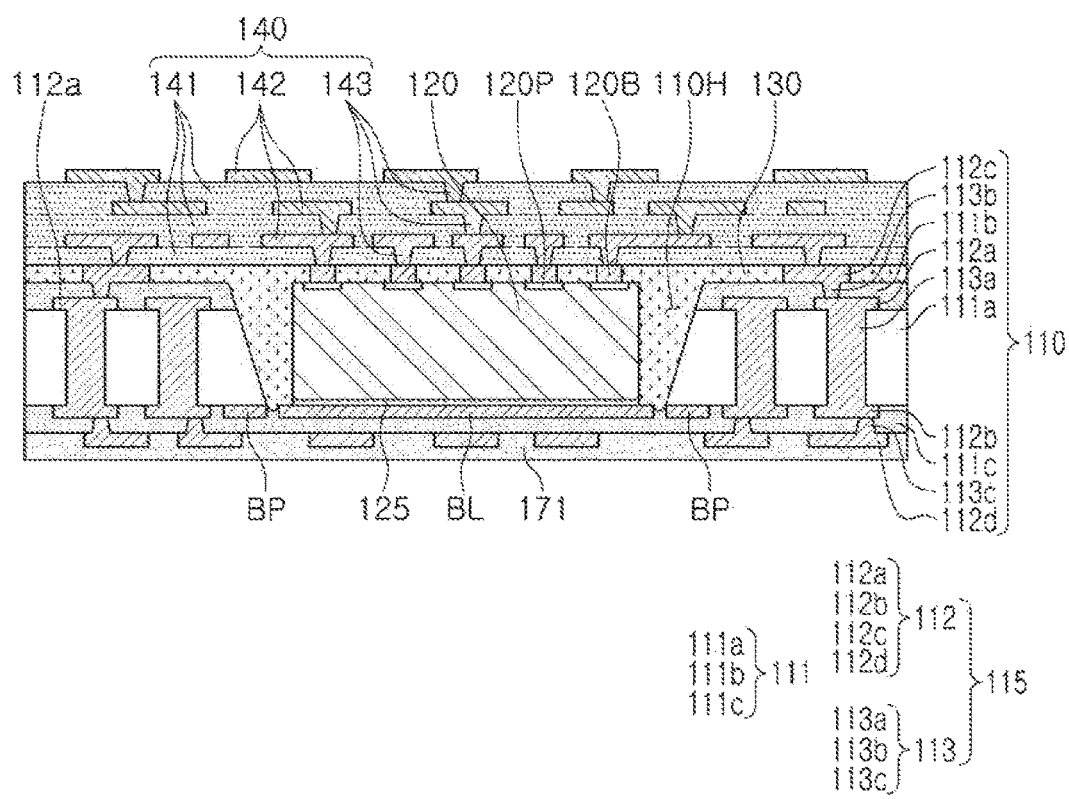

Then, referring to FIG. 13C, the connection member 140 including the redistribution structures 142 and 143 may be formed on the encapsulant 130. The insulating layers 141 may be formed by applying and hardening insulating materials such as PIDs, and the redistribution structures 142 and 143 may be formed by a plating process. The redistribution structures 142 and 143 may include the redistribution layers 142 and the connection vias 143, and may be connected to the metal bumps 120B and the third wiring layer 112c through the connection vias 143 formed in insulating layers 141 adjacent thereto. The numbers of insulating layers 141, redistribution layers 142, and connection vias 143 may be changed depending on a design.

Then, referring to FIG. 13D, the first passivation layer 151 may be formed on the connection member 140, and the underbump metal layers 160 may be formed by any known metallization method. The openings exposing partial regions of the redistribution layer 142 may be formed in the first passivation layer 151, and the underbump metal layers 160 may be formed in the openings of the first passivation layer 151 to be connected to the partial regions of the redistribution layer 142. The underbump metal layers 160 may be formed in the openings of the first passivation layer 151 by any known metallization method using any known conductive material such as a metal, but are not limited thereto.

Figure 13E:
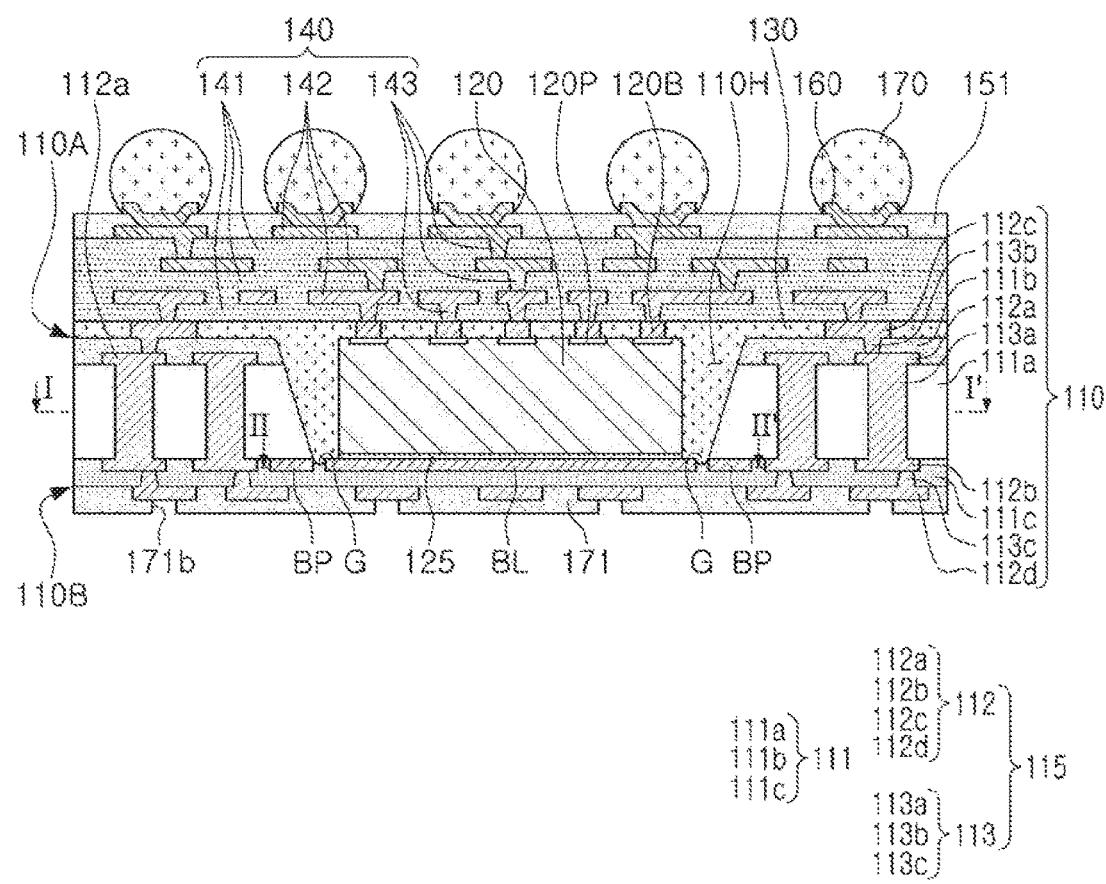

Then, referring to FIG. 13E, the carrier film 200 may be removed, the openings 171b may be formed in the second passivation layer 171 to expose at least portions of the fourth wiring layer 112d, and the electrical connection structures 170 may be formed on the underbump metal layers 160. Each of the electrical connection structures 170 may be formed of a conductive material, for example, a low melting point metal such as an Sn—Al—Cu alloy. Each of the electrical connection structures 170 may be a land, a ball, a pin, or the like. The electrical connection structures 170 may be formed as a multilayer or single layer structure. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less. The electric connection structures 170 may be disposed on the mainboard of the electronic device or on another package and be fixed to the mainboard or another package while being electrically connected to the mainboard or another package by a reflow process.

Figure 14:
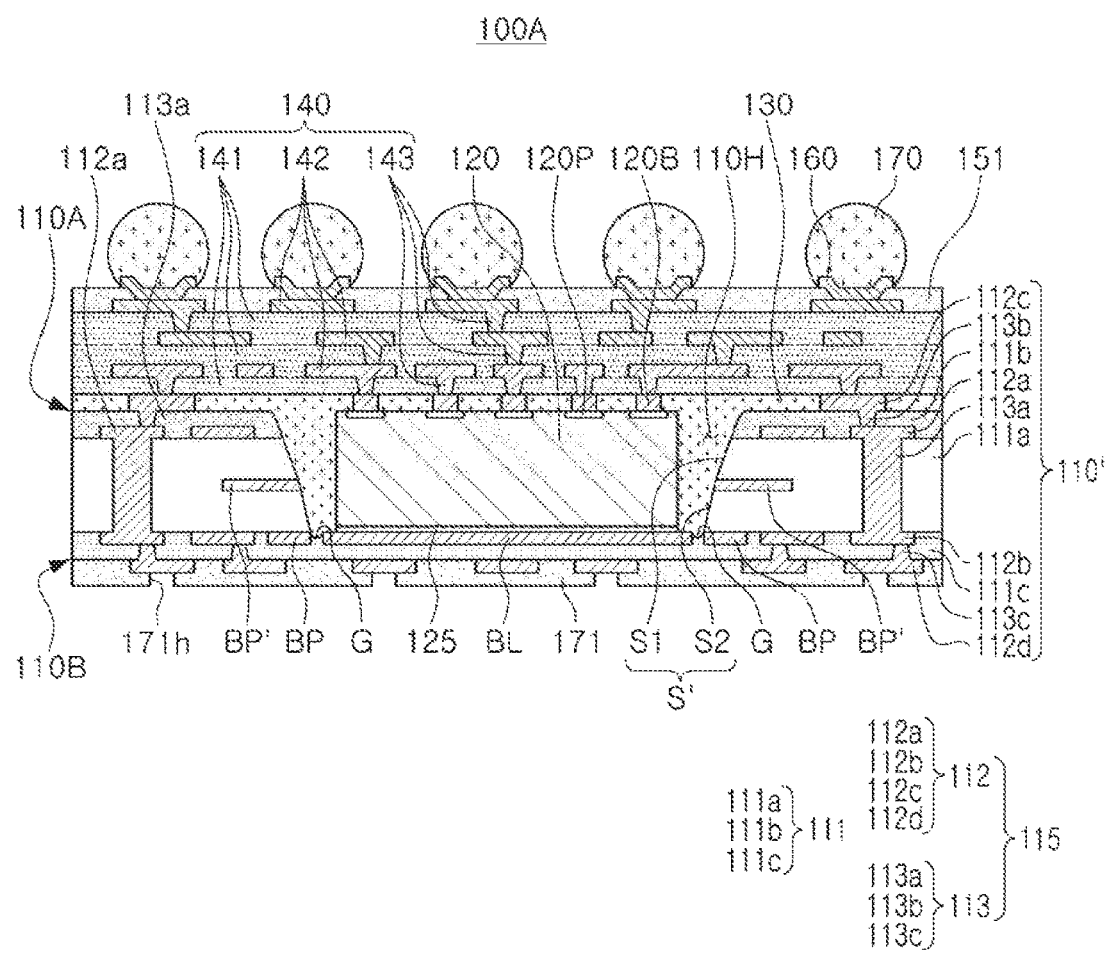
FIG. 14 is a schematic cross-sectional view illustrating a fan-out semiconductor package according to another exemplary embodiment in the present disclosure.

FIG. 14 is a schematic cross-sectional view illustrating a fan-out semiconductor package according to another exemplary embodiment in the present disclosure.

Referring to FIG. 14, it may be understood that a fan-out semiconductor package 100A according to another exemplary embodiment in the present disclosure is similar to the fan-out semiconductor package 100 illustrated in FIGS. 9 through 10B except that it includes an additional guide pattern BP' disposed to surround a recess portion 110H on a level between a bottom surface of the recess portion 110H and a first surface 110A of a frame 110. Components according to the present exemplary embodiments may be understood with reference to the description for the same or similar components of the fan-out semiconductor package 100 illustrated in FIGS. 9 through 10B unless explicitly described to the contrary.

The semiconductor package 100A according to the present exemplary embodiment may include a first guide pattern BP and a stopper layer BL each similar to the guide pattern BP and the stopper layer BL illustrated in FIG. 9, and may further include a second guide pattern BP' disposed on a level above the first guide pattern BP, that is, the level between the bottom surface of the recess portion 110H and the first surface 110A of the frame 110. The second guide pattern BP' may be disposed in a first insulating layer 111a.

The second guide pattern BP' may be formed of a material having an etch rate lower than that of the insulating layers of the frame 110, similar to the first guide pattern BP. For example, the second guide pattern BP' may include a metal such as copper (Cu). The second guide pattern BP' may be disposed adjacent to a wall S' of the recess portion, and the second guide pattern BP' may be partially exposed to the wall S' of the recess portion as in the present exemplary embodiment, but is not limited thereto. A wiring structure 115 of the frame 110 may include a wiring layer (not illustrated) disposed on the same level as that of the second guide pattern BP'. In another exemplary embodiment, the second guide pattern BP' may be disposed between first and second insulating layers 111a and 111b and be formed together with a first wiring layer 112a. The second guide pattern BP' may also be configured so as not to be directly connected to the wiring layer disposed on the same level as that of the second guide pattern BP', but is not limited thereto. The number of layers of the second guide pattern BP' is not particularly limited, but may be more than that shown in the drawings.

The fan-out semiconductor package 100A according to the present exemplary embodiment may include the first guide pattern BP disposed in the frame 110 along an edge of the bottom surface of the recess portion 110H. The first guide pattern BP may be used as an etching barrier structure for forming the recess portion together with the stopper layer BL described above.

The second guide pattern BP' may be disposed on an intermediate level of the wall S' of the recess portion, and may be used to control a profile (for example, an angle of inclination) of the wall S' of the recess portion 110H, similar to the first guide pattern BP. A profile of an upper region S1 of the wall S' of the recess portion may be controlled by controlling positions of the second guide pattern BP' and another stopper layer BL' (see FIG. 15A) and an interval between the second guide pattern BP' and another stopper layer BL'. Then, a profile of a lower region S2 of the wall S' of the recess portion may be controlled by controlling positions of the first guide pattern BP and the stopper layer BL and an interval between the first guide pattern BP and the stopper layer BL. The upper region S1 and the lower region S2 of the wall S' of the recess portion obtained in the present exemplary embodiment may have different inclined profiles (for example, angles of inclination).

The second guide pattern BP' according to the present exemplary embodiment may be used to control a profile of a wall of a relatively deep recess portion or precisely control the profile of the wall of the recess portion. In addition, the second guide pattern BP' may also serve to protect the wiring structure 115 of the frame 110 disposed adjacent to the recess portion 110H.

In the present exemplary embodiment, the second guide pattern BP' may have the same shape as that of the first guide pattern BP, but may also have a shape (see FIGS. 11A and 11B) different from that of the first guide pattern. In addition, a case in which the second guide pattern BP' is used together with the first guide pattern BP is described by way of example, but only the second guide pattern BP' may be used, if necessary. In this case, the stopper layer BL disposed on the bottom surface of the recess portion may be formed to cover the entirety of the bottom surface of the recess portion.

FIGS. 15A through 15D are schematic cross-sectional views illustrating processes of forming a frame of the fan-out semiconductor package of FIG. 14.

Figure 15A:
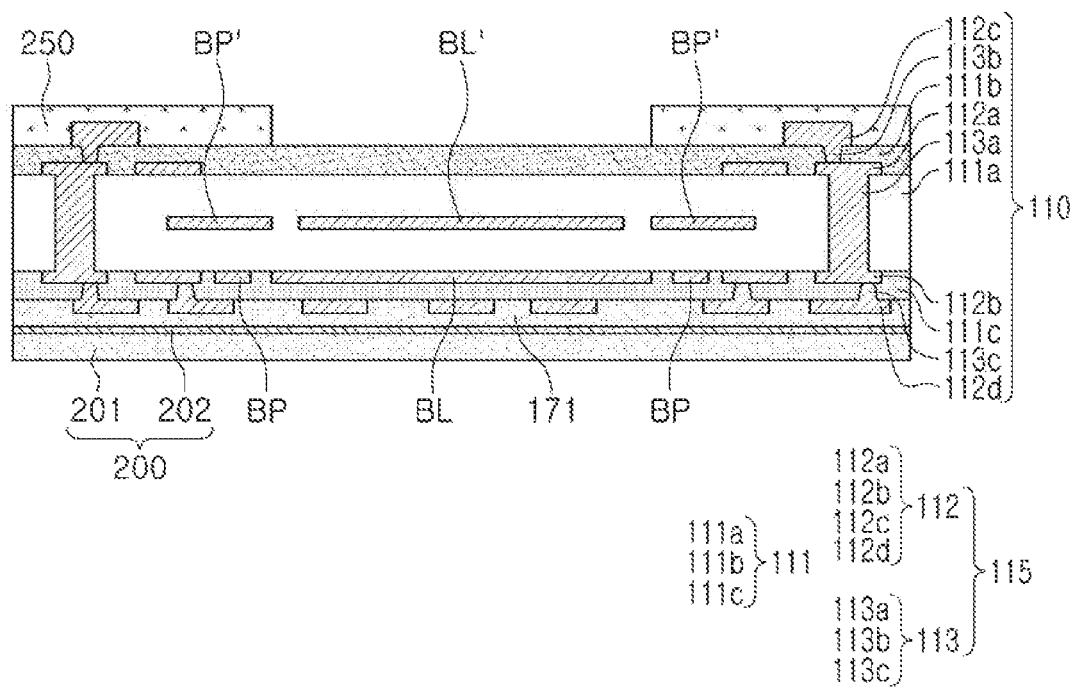
FIGS. 15A through 15D are schematic cross-sectional views illustrating processes of forming a frame of the fan-out semiconductor package of FIG. 14.

First, referring to FIG. 15A, a frame 110' may be disposed on a carrier film 220, and a mask layer 250 having an open region may be formed on a first surface 110A of the frame 110'. The frame 110' according to the present exemplary embodiment may include a wiring structure 115 similar to that of the frame 110 illustrated in FIGS. 12B and 12C, and a first stopper layer BL and a first guide pattern BP disposed between first and third insulating layers 111a and 111c. In addition, the frame 110' may include a second stopper layer BL' and a second guide pattern BP' disposed on a level above the first guide pattern BP, that is, in the first insulating layer 111a. The second stopper layer BL' and the second guide pattern BP' may be spaced apart from each other, similar to a disposition of the first stopper layer BL and the first guide pattern BP.

Figure 15B:
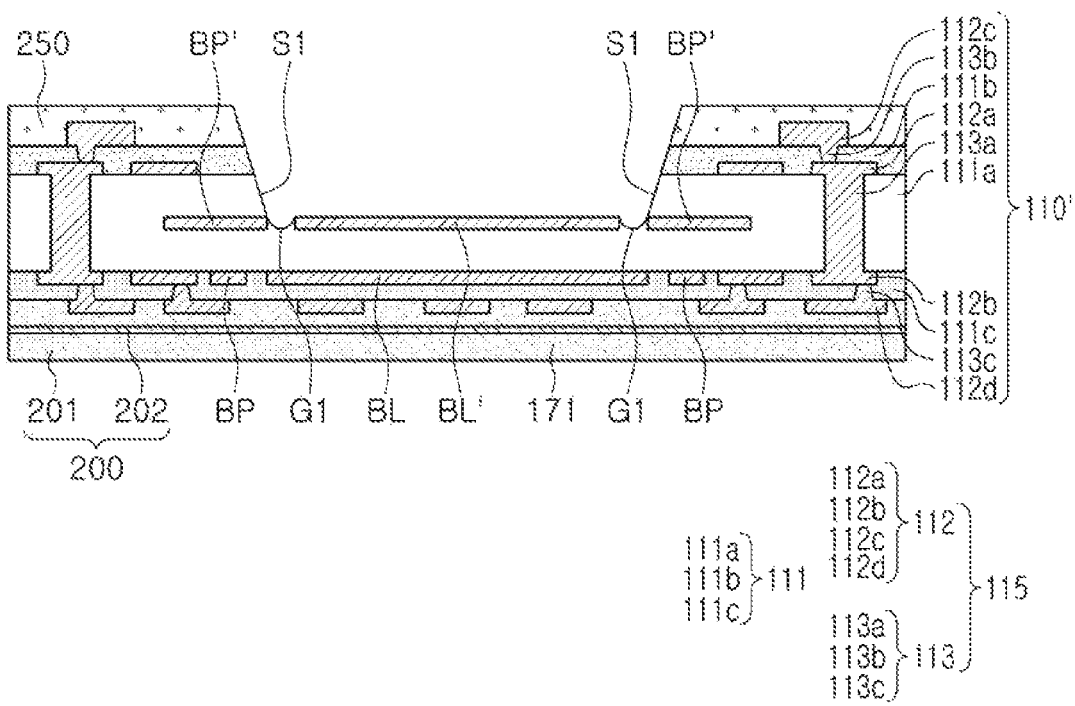

Then, referring to FIG. 15B, a primary etching process for forming a recess portion may be performed using the mask layer 250 having the open region. The primary etching process may be performed up to the second stopper layer BL'. When an etching depth is adjacent to the second stopper layer BL', etching may be slowly performed on the second stopper layer BL', and excessive etching may be performed in a spaced region between the second stopper layer BL' and the second guide pattern BP' to form a groove G1. In this process, a wall S1 of an upper region of the recess portion may have a steep angle of inclination. That is, an inclined region may become narrow. In this case, an edge of a lower portion of the recess portion may be defined by the second guide pattern BP'.

Figure 15C:
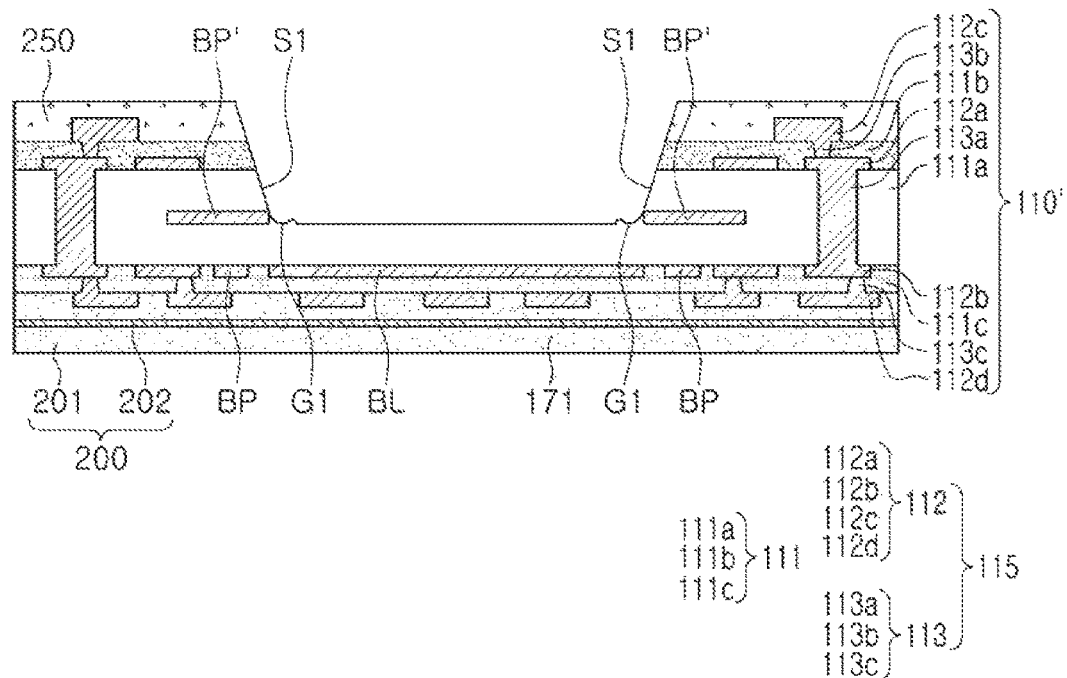
Figure 15D:
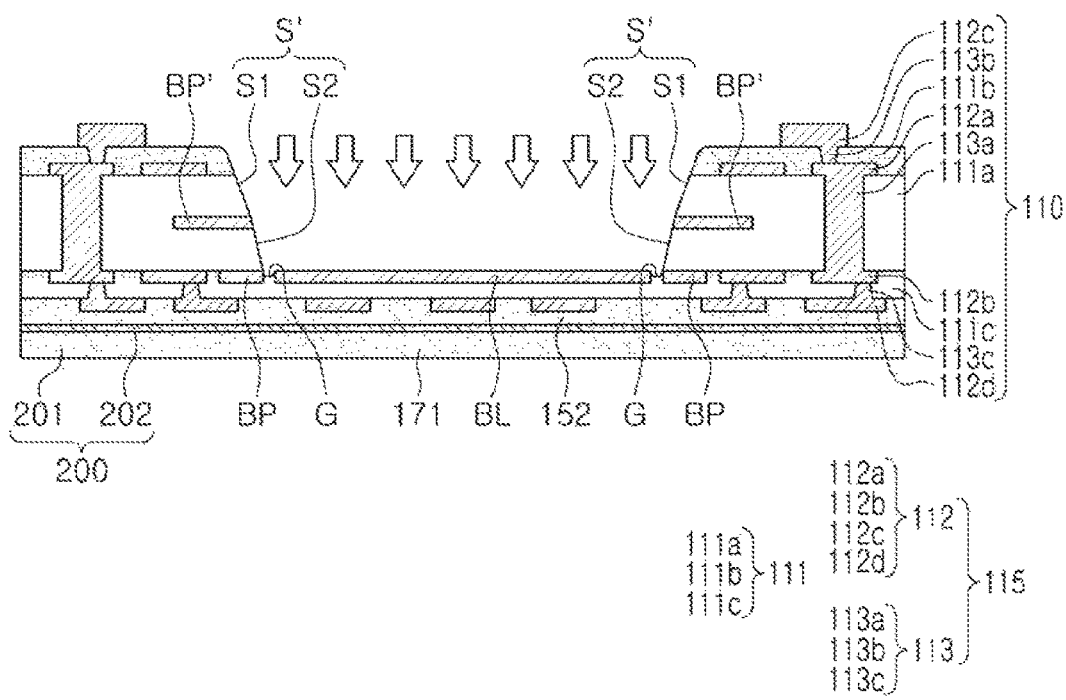

Then, as illustrated in FIG. 15C, the second stopper layer BL' may be removed, and as illustrated in FIG. 15D, a secondary etching process for forming the recess portion may be performed using the mask layer 250 having the open region. The secondary etching process may be performed up to the first stopper layer BL. When an etching depth is adjacent to the first stopper layer BL, etching may be slowly performed on the first stopper layer BL, and excessive etching may be performed in a spaced region between the first stopper layer BL and the first guide pattern BP to form a groove G. In this process, an inclined region of a wall S2 of a lower region of the recess portion may become narrow. In this case, an edge of a lower portion of the recess portion may be defined by the first guide pattern BP. As described above, the frame 110' having the recess portion 110H and the wiring structure 115 together with the guide pattern BP' disposed on an intermediate level may be provided. According to the present exemplary embodiment, the recess portion 110H having a wall having a desired profile may be formed using the second guide pattern BP' disposed on the intermediate level together with the first guide pattern BP.

The fan-out semiconductor package illustrated in FIG. 14 may be provided by applying the processes of manufacturing a fan-out semiconductor package illustrated in FIGS. 13A through 13E as subsequent processes.

Figure 16:
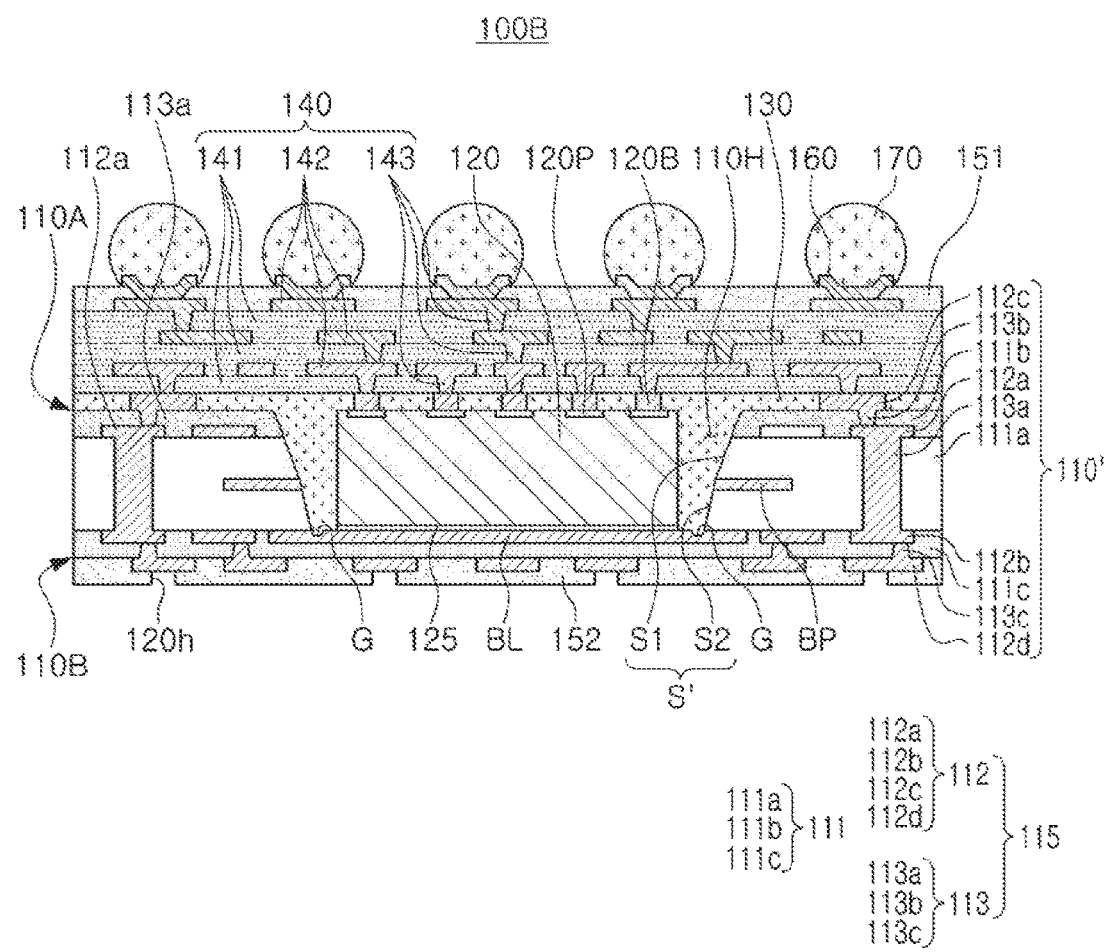
FIG. 16 is a schematic cross-sectional view illustrating a fan-out semiconductor package according to another exemplary embodiment in the present disclosure.

FIG. 16 is a schematic cross-sectional view illustrating a fan-out semiconductor package according to another exemplary embodiment in the present disclosure.

Referring to FIG. 16, it may be understood that a fan-out semiconductor package 100B according to another exemplary embodiment in the present disclosure is similar to the fan-out semiconductor package 100A according to another exemplary embodiment illustrated in FIG. 14 except that a guide pattern BP is disposed to surround a recess portion 110H on a level between a bottom surface of the recess portion 110H and a first surface 110A of a frame 110 and a stopper layer BL has an area greater than that of the bottom surface of the recess portion 110H, such that end portions of the stopper layer BL are embedded in the frame 110, and a groove G is thus formed in the stopper layer BL. Components according to the present exemplary embodiments may be understood with reference to the description for the same or similar components of the fan-out semiconductor package 100A according to another exemplary embodiment illustrated in FIG. 14 unless explicitly described to the contrary.

In the fan-out semiconductor package 100B according to the present exemplary embodiment, the stopper layer BL may be disposed on the bottom surface of the recess portion 110H, and the guide pattern BP is not disposed on the bottom surface of the recess portion 110H, but may be disposed on a level above the stopper layer BL, that is, the level between the bottom surface of the recess portion 110H and the first surface 110A of the frame 110.

The guide pattern BP may be disposed adjacent to a wall S' of the recess portion, and the guide pattern BP may be partially exposed to the wall S' of the recess portion as in the present exemplary embodiment, but is not limited thereto. A wiring structure 115 of the frame 110 may include a wiring layer (not illustrated) disposed on the same level as that of the guide pattern BP. In another exemplary embodiment, the guide pattern BP may be disposed between first and second insulating layers 111a and 111b and be formed together with a first wiring layer 112a. The guide pattern BP may also be configured so as not to be directly connected to the wiring layer disposed on the same level as that of the guide pattern BP, but is not limited thereto.

The guide pattern BP may be disposed on an intermediate level of the wall S' of the recess portion, and may be used to control a profile (for example, an angle of inclination) of the wall S' of the recess portion 110H. A profile of an upper region S1 and a profile of a lower region S2 of the wall S' of the recess portion may be controlled by controlling positions of the guide pattern BP and another stopper layer BL' (see FIG. 16A) and an interval between the guide pattern BP and another stopper layer BL'. The upper region S1 and the lower region S2 of the wall S' of the recess portion obtained in the present exemplary embodiment may have different inclined profiles (for example, angles of inclination).

The guide pattern BP according to the present exemplary embodiment may be usefully used to control a profile of a wall of a relatively deep recess portion or precisely control the profile of the wall of the recess portion. In addition, the guide pattern BP may also serve to protect the wiring structure 115 of the frame 110 disposed adjacent to the recess portion 110H.

In the present exemplary embodiment, the stopper layer BL may be formed to cover the entirety of the bottom surface of the recess portion 110H, and the groove G may thus be formed in the stopper layer BL. In this case, a region of the stopper layer BL in which the groove G is formed may have a thickness smaller than that of other regions of the stopper layer BL.

FIGS. 17A through 17D are schematic cross-sectional views illustrating processes of forming a frame of the fan-out semiconductor package of FIG. 16.

Figure 17A:
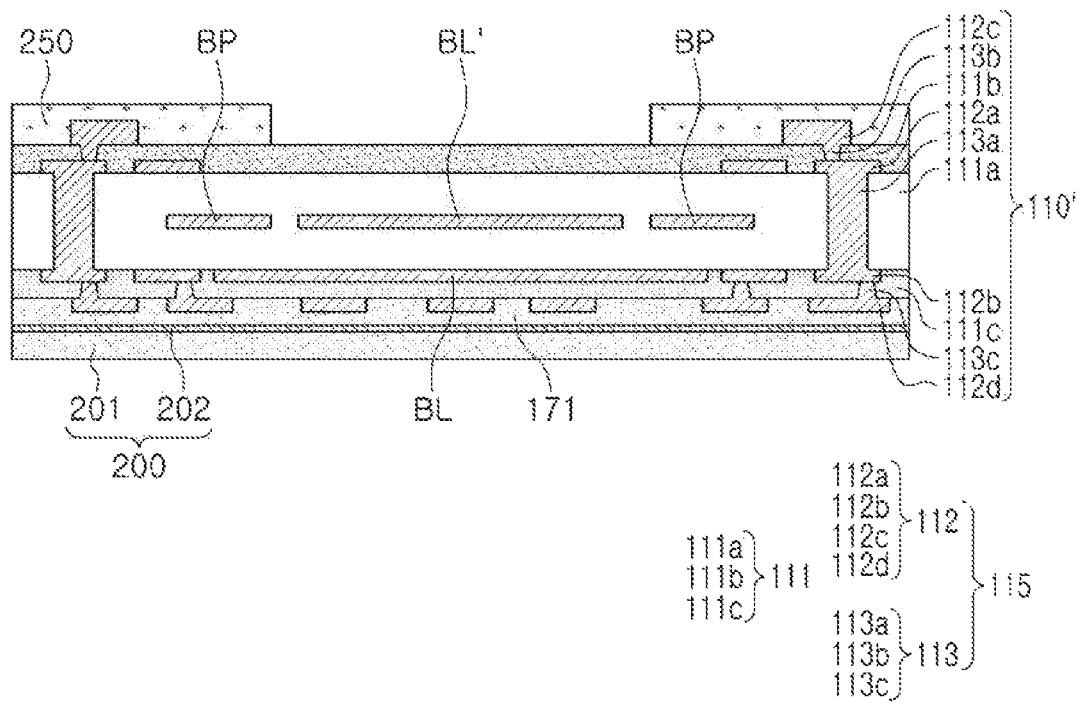
FIGS. 17A through 17D are schematic cross-sectional views illustrating processes of forming a frame of the fan-out semiconductor package of FIG. 16.

First, referring to FIG. 17A a frame 110' may be disposed on a carrier film 220, and a mask layer 250 having an open region may be formed on a first surface 110A of the frame 110'. The frame 110' according to the present exemplary embodiment may include a wiring structure 115 similar to that of the frame 110 illustrated in FIGS. 12B and 12C, and a first stopper layer BL disposed between first and third insulating layers 111a and 111c. In addition, the frame 110' according to the present exemplary embodiment may include a second stopper layer BL' and a guide pattern BP disposed on a level above the stopper layer BL, that is, in the first insulating layer 111a. The second stopper layer BL' and the guide pattern BP may be spaced apart from each other.

Figure 17B:
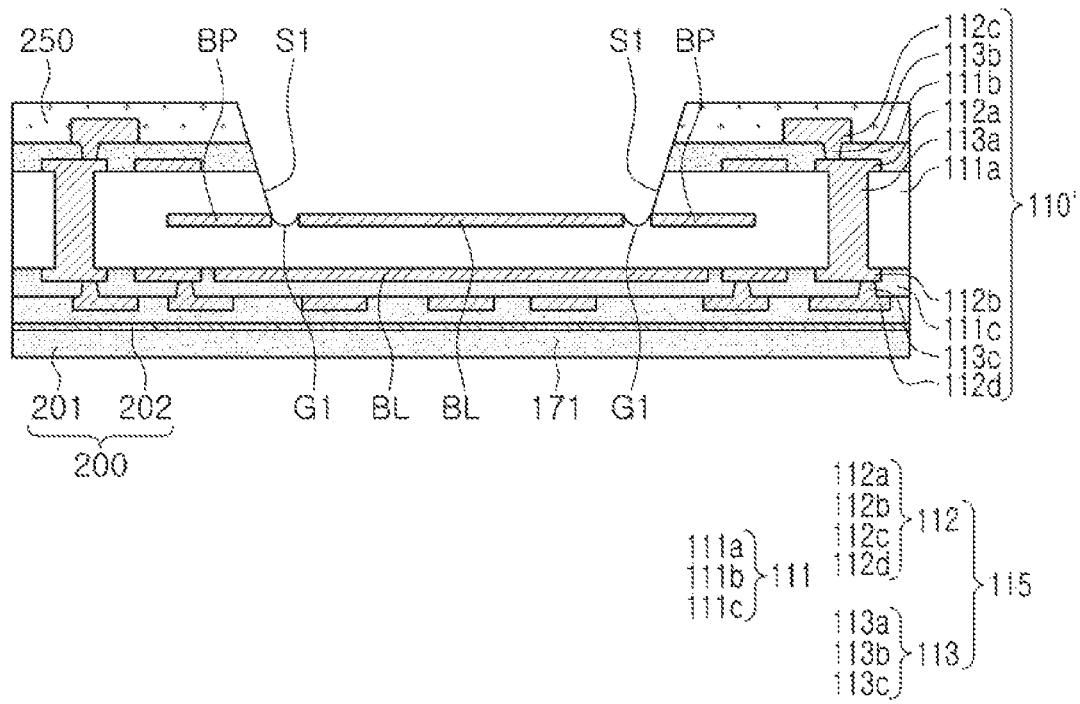

Then, referring to FIG. 17B, a primary etching process for forming a recess portion may be performed using the mask layer 250 having the open region. The primary etching process may be performed up to the second stopper layer BL'. When an etching depth is adjacent to the second stopper layer BL', etching may be slowly performed on the second stopper layer BL', and excessive etching may be performed in a spaced region between the second stopper layer BL' and the guide pattern BP to form a groove G1. In this process, a wall S1 of an upper region of the recess portion may have a steep angle of inclination. That is, an inclined region may become narrow. In this case, an edge of a lower portion of the recess portion may be defined by the guide pattern BP.

Figure 17C:
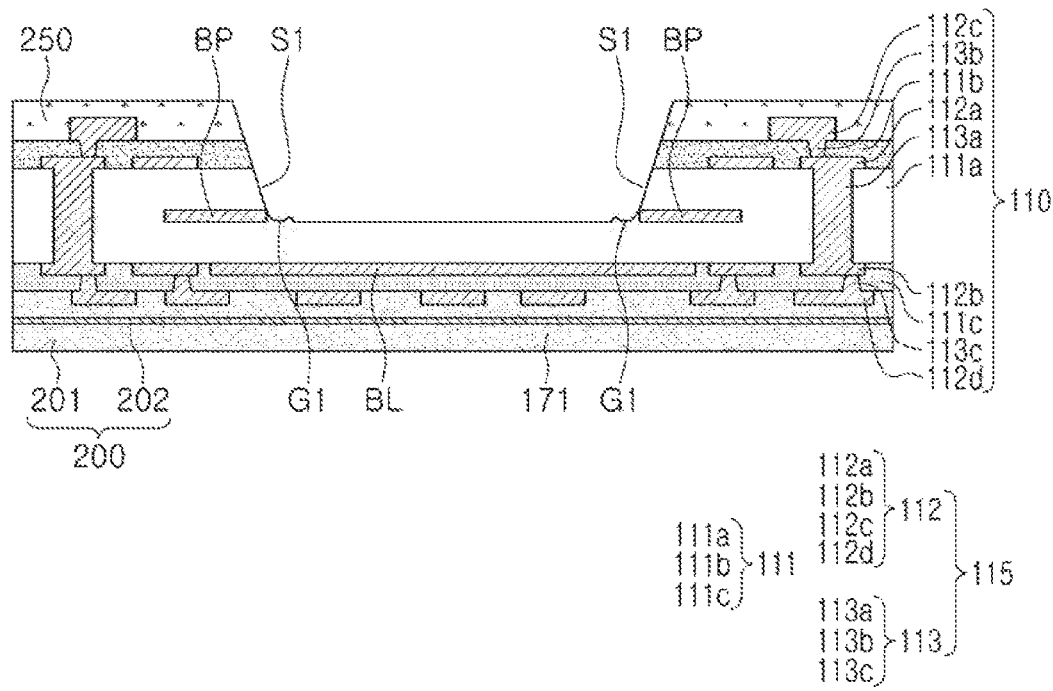
Figure 17D:
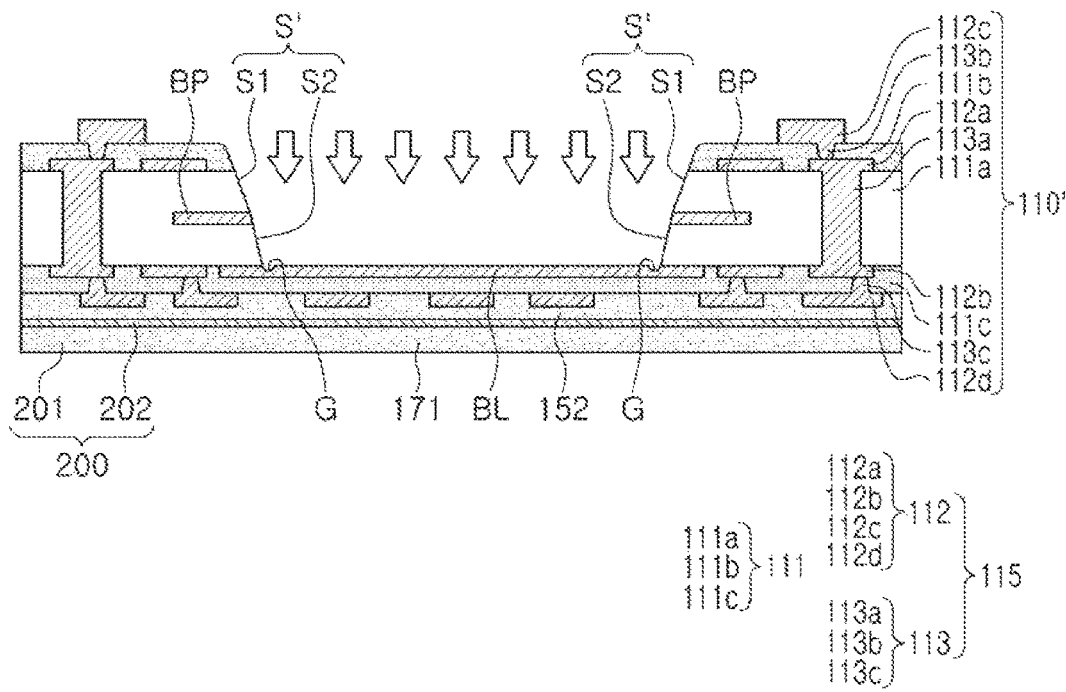

Then, as illustrated in FIG. 17C, the second stopper layer may be removed, and as illustrated in FIG. 17D, a secondary etching process for forming the recess portion may be performed using the mask layer 250 having the open region. The secondary etching process may be performed up to the first stopper layer BL. When an etching depth is adjacent to the first stopper layer BL, etching may be slowly performed on the first stopper layer BL, and excessive etching may be performed in a region adjacent to the wall of the recess portion of the first stopper layer BL to form a groove G. In this process, an inclined region of a wall S2 of a lower region of the recess portion may become narrow. As described above, the frame 110' having the recess portion 110H and the wiring structure 115 together with the guide pattern BP disposed on an intermediate level may be provided. According to the present exemplary embodiment, the recess portion 110H having a wall having a desired profile may be formed using the guide pattern BP disposed on the intermediate level.

The fan-out semiconductor package illustrated in FIG. 16 may be provided by applying the processes of manufacturing a fan-out semiconductor package illustrated in FIGS. 13A through 13E as subsequent processes.

As set forth above, according to the exemplary embodiments in the present disclosure, a fan-out semiconductor package in which a frame having a blind recess portion is introduced and a profile of a wall of the blind recess portion may be controlled may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion and a stopper layer disposed on a bottom surface of the recess portion;
   a semiconductor chip disposed in the recess portion and having connection pads, an active surface on which the connection pads are disposed, and an inactive surface opposing the active surface and so that disposed on the stopper layer;

an encapsulant covering at least portions of the semiconductor chip and filling at least portions of the recess portion;

a connection member disposed on the frame and the active surface of the semiconductor chip and including a redistribution layer electrically connecting the plurality of wiring layers of the frame and the connection pads of the semiconductor chip to each other; and a guide pattern disposed adjacent to a wall of the recess portion and disposed in the frame, wherein an edge of the bottom surface of the recess portion has a groove portion.

2. The fan-out semiconductor package of claim 1, wherein the guide pattern is disposed on a level above the stopper layer, and the groove portion is formed in the stopper layer.

3. The fan-out semiconductor package of claim 2, wherein a region of the stopper layer having the groove portion has a thickness smaller than that of other regions of the stopper layer.

4. The fan-out semiconductor package of claim 1, wherein the guide pattern is disposed on the same level as that of the stopper layer, and the connection member further includes an insulating layer covering the guide pattern and the stopper layer and including a portion between the guide pattern and the stopper layer, the portion of the insulating layer between the guide pattern and the stopper layer having the groove portion.

5. The fan-out semiconductor package of claim 4, wherein the guide pattern and the stopper layer are physically spaced apart from each other.

6. The fan-out semiconductor package of claim 5, wherein the groove portion has a ring shape having a closed loop along the edge of the bottom surface of the recess portion.

7. The fan-out semiconductor package of claim 4, wherein the guide pattern and the stopper layer have one or more connection portions connecting the guide pattern and the stopper layer to each other, and the guide pattern, the stopper layer, and the one or more connection portions have two or more slits surrounded by the guide pattern, the stopper layer, and the one or more connection portions.

8. The fan-out semiconductor package of claim 7, wherein the groove portion is a plurality of groove portions each formed along the edges of the bottom surface of the recess portion.

9. The fan-out semiconductor package of claim 1, wherein each of the guide pattern and the stopper layer includes a metal, at least one of the plurality of wiring layers includes a ground, and at least one of the guide pattern and the stopper layer is electrically connected to the ground.

10. The fan-out semiconductor package of claim 1, wherein the stopper layer has a planar area greater than that of the inactive surface of the semiconductor chip.

11. The fan-out semiconductor package of claim 1, wherein the bottom surface of the recess portion has a planar area greater than that of the inactive surface of the semiconductor chip.

12. The fan-out semiconductor package of claim 1, wherein the inactive surface of the semiconductor chip is attached to the stopper layer through an adhesive member.

13. The fan-out semiconductor package of claim 1, wherein the wall of the recess portion is tapered.

14. The fan-out semiconductor package of claim 1, wherein the wall of the recess portion has a plurality of different profiles.

15. The fan-out semiconductor package of claim 1, further comprising metal bumps disposed on the connection pads of the semiconductor chip, and upper surfaces of the metal bumps are coplanar with an upper surface of the encapsulant.

16. The fan-out semiconductor package of claim 15, wherein an upper surface of an uppermost wiring layer of the plurality of wiring layers of the frame or an upper surface of an uppermost connection via layer of the plurality of connection via layers of the frame is coplanar with the upper surfaces of the metal bumps and the upper surface of the encapsulant.

17. The fan-out semiconductor package of claim 1, wherein the plurality of insulating layers include a core insulating layer, one or more first build-up insulating layers disposed on a lower surface of the core insulating layer, and one or more second build-up insulating layers disposed on an upper surface of the core insulating layer, and the core insulating layer has a thickness greater than that of each of the first and second build-up insulating layers.

18. The fan-out semiconductor package of claim 17, wherein the number of first build-up insulating layers and the number of second build-up insulating layers are the same as each other.

19. The fan-out semiconductor package of claim 17, wherein the recess portion penetrates through at least the core insulating layer and penetrates through at least one of the one or more second build-up insulating layers.

20. The fan-out semiconductor package of claim 17, wherein the plurality of wiring layers include first connection vias penetrating through the first build-up insulating layer and second connection vias penetrating through the second build-up insulating layer, the first connection vias and the second connection vias being tapered in directions opposite to each other.

21. The fan-out semiconductor package of claim 1, further comprising:

a first passivation layer disposed on the connection member and having openings exposing at least portions of the redistribution layer;

underbump metal layers disposed in the openings of the first passivation layer and connected to at least portions of the exposed redistribution layer; and electrical connection structures disposed on the first passivation layer and connected to the underbump metal layers.

22. The fan-out semiconductor package of claim 1, further comprising a second passivation layer disposed beneath the frame and having openings exposing at least portions of a lowermost wiring layer of the plurality of wiring layers.

23. The fan-out semiconductor package of claim 1, wherein the encapsulant fills the groove portion.

24. The fan-out semiconductor package of claim 1, wherein at least one of the wiring layers are disposed on the level below the stopper layer.

* * * * *